United States Patent
Kee et al.

(10) Patent No.: US 7,760,025 B2
(45) Date of Patent: Jul. 20, 2010

(54) MULTI-PRIMARY DISTRIBUTED ACTIVE TRANSFORMER AMPLIFIER POWER SUPPLY AND CONTROL

(75) Inventors: Scott Kee, Dana Point, CA (US); Ichiro Aoki, San Clemente, CA (US); Hui Wu, Pittsford, NY (US); Seyed-Ali Hajimiri, Pasadena, CA (US); Frank Carr, Tustin, CA (US); Rahul Magoon, Irvine, CA (US); Alexandre Kral, Laguna Niguel, CA (US); Afshin Mellati, Laguna Niguel, CA (US); Florian Bohn, Tustin, CA (US); Donald McGlymont, Dana Point, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 0 days.

(21) Appl. No.: 12/345,281

(22) Filed: Dec. 29, 2008

(65) Prior Publication Data

US 2009/0102592 A1    Apr. 23, 2009

Related U.S. Application Data

(63) Continuation of application No. 10/975,316, filed on Oct. 28, 2004, now Pat. No. 7,471,153.

(60) Provisional application No. 60/515,075, filed on Oct. 28, 2003.

(51) Int. Cl.
*H03F 3/68* (2006.01)
(52) U.S. Cl. .................. 330/295; 330/307; 330/276; 333/100
(58) Field of Classification Search .................. 330/295, 330/307, 276; 333/100
See application file for complete search history.

(56) References Cited

U.S. PATENT DOCUMENTS

| | | | | |
|---|---|---|---|---|
| 6,577,219 | B2 * | 6/2003 | Visser | 336/200 |
| 6,816,012 | B2 * | 11/2004 | Aoki et al. | 330/276 |

* cited by examiner

*Primary Examiner*—Patricia Nguyen
(74) *Attorney, Agent, or Firm*—Jackson Walker L.L.P.; Christopher J. Rourk

(57) ABSTRACT

An integrated power combiner is disclosed. The power combiner includes a first circular geometry primary winding having one or more inductive elements, such as an active winding with one or more driver stages. A circular geometry secondary winding is disposed adjacent to the first primary winding, such as an active winding with one or more driver stages. A second circular geometry primary winding is disposed adjacent to the secondary winding and has one or more inductive elements. One or more connections are provided between one or more of the inductive elements of the first circular geometry primary winding and one or more of the inductive elements of the second circular geometry primary winding.

20 Claims, 19 Drawing Sheets

MULTI-PRIMARY DISTRIBUTED ACTIVE TRANSFORMER AMPLIFIER POWER SUPPLY AND CONTROL

RELATED APPLICATIONS

This application is a continuation application of U.S. Ser. No. 10/975,316, filed Oct. 28, 2004, entitled Multi-Primary Distributed Active Transformer Amplifier Power Supply and Control; and claims priority to U.S. Provisional Application No. 60/515,075, filed Oct. 28, 2003, both of which are incorporated herein by reference.

This application claims priority to U.S. Provisional application 60/515,075, filed Oct. 28, 2003, which is hereby incorporated by reference for all purposes.

FIELD OF THE INVENTION

An integrated power amplifier is disclosed. In particular, a distributed active transformer is disclosed for integrated power amplifiers with fully integrated single-band or multi-band integrated power amplifiers.

BACKGROUND OF THE INVENTION

Distributed active transformers (DATs) are known in the art. In particular, U.S. Pat. No. 6,737,948 discloses a circular geometry power amplifier architecture that uses distributed active transformers in a loop configuration to amplify an input signal. Although the DAT of U.S. Pat. No. 6,737,948 provides many useful and novel features, additional useful and novel features are provided herein for use with DATs or in other suitable applications.

SUMMARY OF THE INVENTION

In accordance with the present invention, a system and method for DAT power supply and control are provided that overcome problems with DAT power supply and control.

In particular, a system and method for DAT power supply and control are provided that accommodate dual primary windings.

In accordance with an exemplary embodiment of the present invention, an integrated power combiner suitable for implementing amplifiers and oscillators is disclosed. The power combiner includes a first circular geometry primary winding having one or more inductive elements, such as an active winding with one or more driver stages. A circular geometry secondary winding is disposed adjacent to the first primary winding, such as an active winding with one or more driver stages. A second circular geometry primary winding is disposed adjacent to the secondary winding and has one or more inductive elements. One or more connections are provided between one or more of the inductive elements of the first circular geometry primary winding and one or more of the inductive elements of the second circular geometry primary winding.

The present invention provides many important technical advantages. One important technical advantage of the present invention is a system and method for DAT power supply and control that allows dual primary windings to be used in a manner that minimizes losses due to phase differences between the primaries while allowing operation from a higher supply voltage, as well as other important technical advantages that will become apparent upon review of the specification and drawings.

Those skilled in the art will further appreciate the advantages and superior features of the invention together with other important aspects thereof on reading the detailed description that follows in conjunction with the drawings.

DETAILED DESCRIPTION OF THE PREFERRED EMBODIMENTS

Figure 1A:
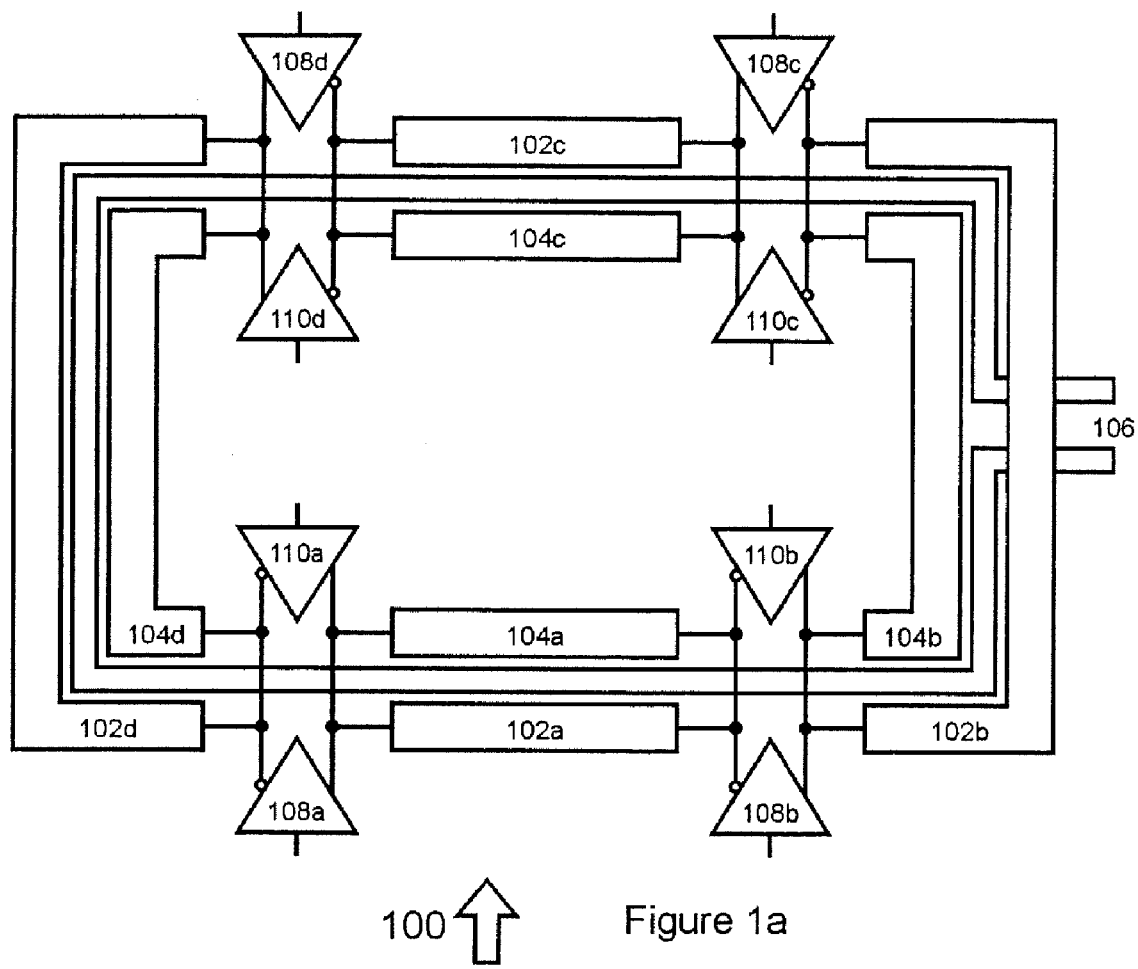
FIG. 1a is a diagram of a DAT in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1a is a diagram of a DAT 100 in accordance with an exemplary embodiment of the present invention. DAT 100 includes a first primary winding 102 with inductive elements 102a through 102d, a second primary winding 104 with inductive elements 104a through 104d, and a secondary winding 106 placed so as to be magnetically coupled to both primary windings. Each inductive element can be a slab having a rectangular shape, a trapezoidal shape, a stepped structure, a curved structure, or other suitable structures. Likewise, each inductive element can be identical to the other inductive elements, can match opposite inductive elements, can be different from each other inductive element, or other suitable configurations of winding inductive elements can be used, including but not limited to two or more integer numbers of inductive elements and a corresponding number of drivers. Primary winding 102 is driven by amplifying entities 108a through 108d, and primary winding 104 is driven by amplifying entities 110a through 110d so that the inductive elements of the DAT can act as a power combiner.

Figure 1B:
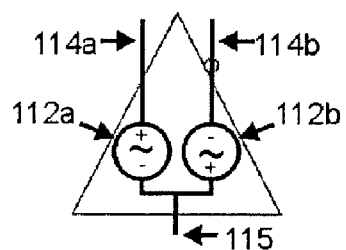
FIG. 1b is a diagram of an amplifying entity in accordance with an exemplary embodiment of the present invention.

FIG. 1b is a diagram of an amplifying entity in accordance with an exemplary embodiment of the present invention. The amplifying entity of FIG. 1b can produce at least two output nodes 114a and 114b, in a manner so that the phase of the voltage produced at node 114b is substantially 180° out of phase with respect to the voltage produced at node 114a. The functions indicated in FIG. 1b can be generally represented by signal sources 112a and 112b which are connected to the outputs 114a and 114b, respectively, so that the generated signals are substantially out of phase with each other and typically of substantially equal amplitude. Furthermore, signal sources 112a and 112b have an additional terminal 115 which is the common point relative to which the two output signals are generated. This node can be used to conduct dc current to the amplifying entity.

Figure 1C:
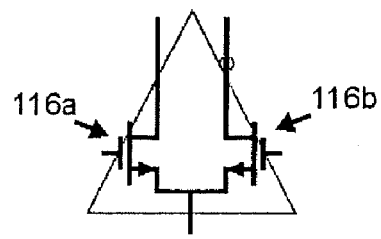
FIG. 1c is a diagram of an amplifier configuration for use as an amplifying entity with complementary outputs in accordance with an exemplary embodiment of the present invention.

FIG. 1c is a diagram of an amplifier configuration for use as an amplifying entity with complementary outputs in accordance with an exemplary embodiment of the present invention. In this circuit, transistors 116a and 116b can be driven with control inputs (i.e., signals applied to the MOSFET gates) which are substantially 180° out of phase, thereby producing output voltages (i.e. outputs from the MOSFET drains) which are similarly out of phase.

Figure 1D:
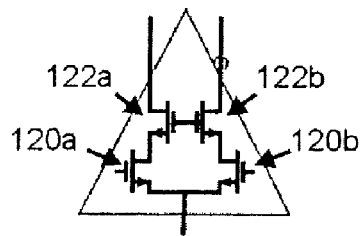
FIG. 1d is a diagram of a differential cascode amplifier for use as an amplifying entity in accordance with an exemplary embodiment of the present invention.

FIG. 1d is a diagram of a differential cascode amplifier for use as an amplifying entity in accordance with an exemplary embodiment of the present invention. The differential cascode amplifier uses transistors 122a and 122b with a common gate connection coupled to transistors 120a and 120b, each of which can be a MOSFET as depicted or other suitable transistors. In operation, the common gate voltage of transistors 122 can be provided a bias voltage, while transistors 120 can be provided complementary drive signals representing the signal to be amplified. The cascode amplifier can allow the use of a higher supply voltage compared to the supply voltage that a non-cascode amplifier using the same transistors can withstand. Furthermore, a cascode amplifier can typically produce a higher power gain than a non-cascode amplifier using the same transistors.

Figure 1E:
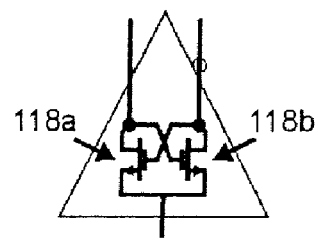
FIG. 1e is a diagram of a cross-coupled oscillator for use as an amplifying entity in accordance with an exemplary embodiment of the present invention.

FIG. 1e is a diagram of a cross-coupled oscillator for use as an amplifying entity in accordance with an exemplary embodiment of the present invention. The control inputs of the two transistors 118a and 118b are each connected to the output of the other. This configuration allows an oscillation to be developed which exists independently of any input signal, which by nature of the cross-coupling will generate outputs that are substantially 180° out of phase with each other. Other suitable configurations of amplifiers or oscillators can also or alternatively be employed to produce the function of FIG. 1b, such as that disclosed in U.S. application Ser. No. 10/687,679, entitled Circular Geometry Oscillators, filed Oct. 17, 2003, which is hereby incorporated by reference for all purposes.

Furthermore, the amplifying entities 108 and 110 of the DAT can be n-type transistor devices, p-type transistor devices, or suitable combinations of both device polarities. The exemplary embodiments of FIGS. 1c, 1d, and 1e depict metal oxide semiconductor field effect devices (MOSFETs), but other suitable devices can also or alternatively be used. The amplifying entities can be implemented using bipolar junction transistors (BJTs), heterojunction bipolar transistors (HBTs), high-electron-mobility field effect transistors (HEMTs), metal semiconductor field effect transistors (MESFETs), or other suitable power conversion devices such as transistors, or suitable combinations of power conversion devices of multiple types.

A further example of a distributed active transformer is disclosed in co-pending and commonly owned U.S. patent application Ser. No. 10/386,001, filed Mar. 11, 2003, which is hereby incorporated by reference for all purposes. Although secondary winding 106 is shown in FIG. 1, the secondary winding in other FIGURES disclosing other exemplary embodiments may be removed for clarity.

Primary 102 and primary 104 can be connected at the amplifying entities as shown, at or near the location where the outputs of the amplifying entities are connected to the DAT inductive elements. These connections may be direct or may include suitable intervening components such as inductors or active devices such as to control current through the connection or other suitable components. In this exemplary embodiment, the two primaries can be driven together with phase synchronization wherein the phases of the voltage waveforms at the drivers of both primaries 102 and 104 are substantially the same. As such, the power loss due to any phase difference between primaries 102 and 104 can be minimized or eliminated for all practical purposes, such that the electro-motive-force (EMF) generated by both primaries 102 and 104 adds constructively at all times and along all points of the primaries 102 and 104. In accordance with this exemplary embodiment, this topology can reduce the effect on the power efficiency of any asymmetry that may exist due to differences in components of DAT 100, such as differences in inductive elements, drivers, connections, or other suitable components. Such asymmetry can result in phase mismatch between primaries and thus reduce the power efficiency of the DAT over temperature and process variations. Furthermore, the connections between the two primaries can assist in equalizing the amplitude of the voltage that is produced on each primary, which may benefit by reducing the imbalance of voltage stresses on the various amplifying entities. Additionally, for some types of suitable amplifying entities, the dc voltage of the DAT primaries may be affected by the properties and asymmetries of the DAT. By using the connections between the two primaries, the dc voltage of the two primaries can be made equal to one another, providing stability to the dc voltage of each primary.

FIGS. 2a through 2g are diagrams of a DAT 200 and associated amplifying entities in accordance with an exemplary embodiment of the present invention. DAT 200 includes a first primary winding 202 with inductive elements 202a through 202d, a second primary winding 204 with inductive elements 204a through 204d, and a secondary winding 206 placed so as to be magnetically coupled to both primary windings. Primary winding 202 is driven by amplifying entities 208a through 208d, and primary winding 204 is driven by amplifying entities 210a through 210d so that the inductive elements of the DAT can act as a power combiner.

Furthermore, the common points of each amplifying entity connected to primary 202 are provided a dc supply, while the amplifying entities connected to primary 204 have their common points provided to a conductive path to ground. Connections are also made between the inductive elements of primaries 202 and 204 similar to those made in DAT 100 which can additionally be used to conduct dc current from amplifying entities 208 to amplifying entities 210. These connections can be made directly or through suitable intervening components which allow dc current to pass. For example, inductors can be used to allow dc current to pass, or control circuits can be employed in these paths to control the amount of the supply current that is allowed to pass through the amplifying entities.

DAT 200 can be used to operate from a supply voltage which is greater, such as two times the supply voltage, than that which would be possible for a DAT where each amplifying entity is connected across the entire supply. The mechanism for this benefit is demonstrated by the current paths, depicted as dashed lines 212a and 212b, from the supply to the ground through two representative amplifying entities 208d and 210d. As can be seen, the current which flows into amplifying entity 208d also flows through amplifying entity 210d before returning to ground. As such, the amplifying entities 208d and 210d share their dc supply currents in a series fashion. If amplifying entity 208d is suitably matched to amplifying entity 210d, the dc voltage drop for each amplifying entity for a given supply current can be made substantially equal. As a result, each amplifying entity will be subjected to substantially the same dc voltage as the other, which is approximately half of the voltage that the two together present to the supply. For example, if a 3.5V supply is applied, each amplifying entity can be subjected to a dc voltage of only 1.75V without placing additional components between the supply and the amplifying entities in order to reduce the voltage, which would typically result in a loss of dc power.

Figure 2A:
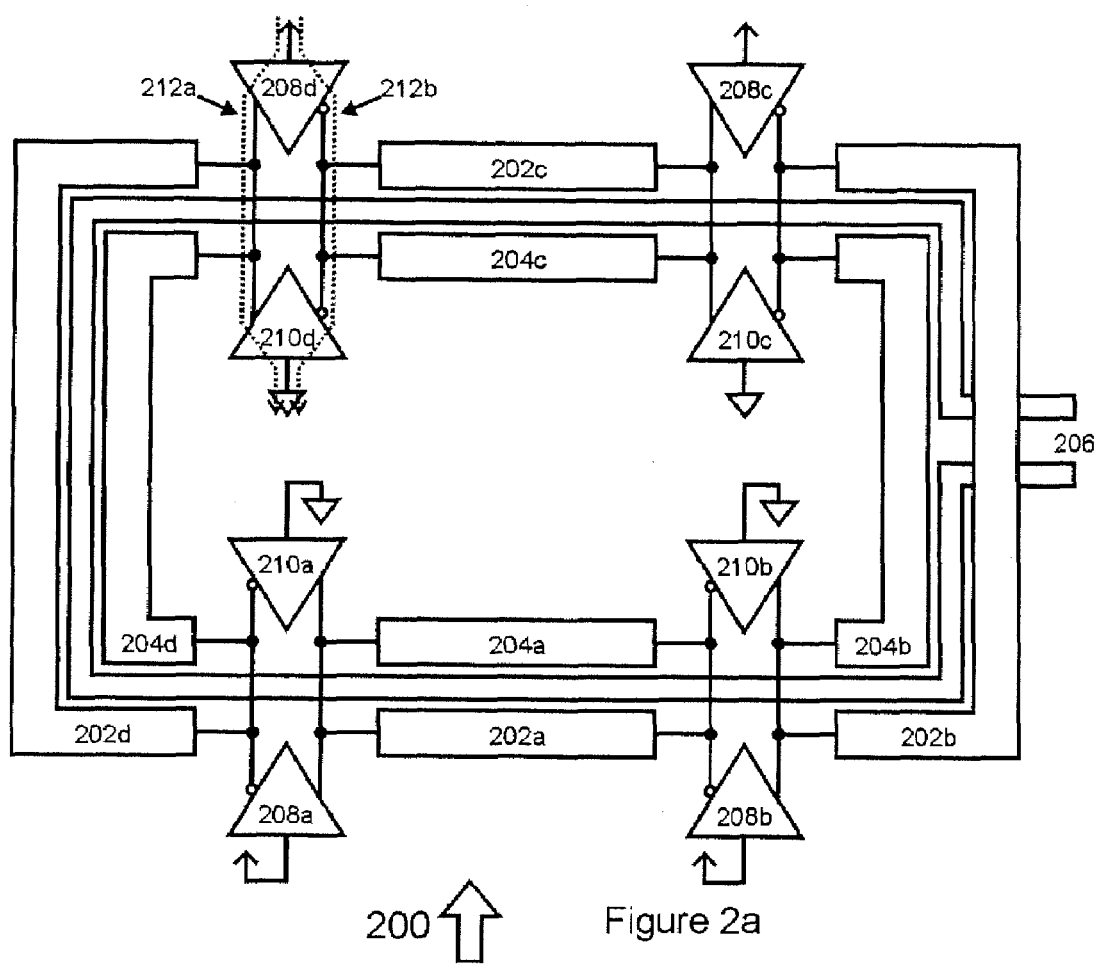
FIGS. 2a through 2g are diagrams of a DAT and associated amplifying entities in accordance with an exemplary embodiment of the present invention.

Although any type of power conversion device may be used, this method and configuration can be beneficial if the amplifying devices connected to primary 202 are composed primarily of p-type devices such as PMOS transistors or PNP bipolar transistors, and the amplifying entities connected to primary 204 are implemented primarily from n-type devices such as NMOS transistors or NPN bipolar transistors. For instance, the complementary amplifiers of FIG. 2b or FIG. 2c could be selected for amplifying entities to be connected to primary 204. Similarly, an oscillator composed of n-type devices such as is depicted in FIG. 2d could be particularly suitable for the amplifying entities to be connected to primary 204. The amplifiers of FIG. 2e and FIG. 2f and the oscillator of FIG. 2 likewise represent amplifying entities that are particularly suitable for connection to primary 202 By using p-type circuits for the amplifying entities connected to the supply voltages and n-type circuits for the amplifying entities connected to ground, the various bias signals and control signals, such as amplifier inputs, will typically be at voltages which are greater than the supply and less than ground. This configuration reduces the difficulty of providing these bias and control signals. Other suitable supply voltages can also or alternatively be applied in a similar manner, such as a positive and a negative supply voltage. Furthermore, other configurations of primaries may be employed such as that the relative placement of the two primaries 202 and 204 depicted in FIG. 2 may be such that primary 202 may be located inside of primary 204 or other suitable configurations.

In one exemplary embodiment, the amplifying entities 208a through 208d and 210a through 210d can be arranged in a cross-differential amplifier configuration, such as that disclosed in co-pending and commonly owned U.S. patent application Ser. No. 10/385,777, filed Mar. 11, 2003, and which is hereby incorporated by reference for all purposes. This may be accomplished, for instance, by implementing amplifying entity 210a in a fashion where it effectively operates as two switches, implementing amplifying entity 208a in a fashion where it effectively operates as two switches, and supplying at least one additional inductor either in series with the dc supply connected to amplifying entity 208a, in series with the ground connected to amplifying entity 210a, or inductors in series with both connections. If this is done for the other three sets of amplifying entities, each amplifying entity may be similarly made to operate in cross-differential mode.

Figure 3:
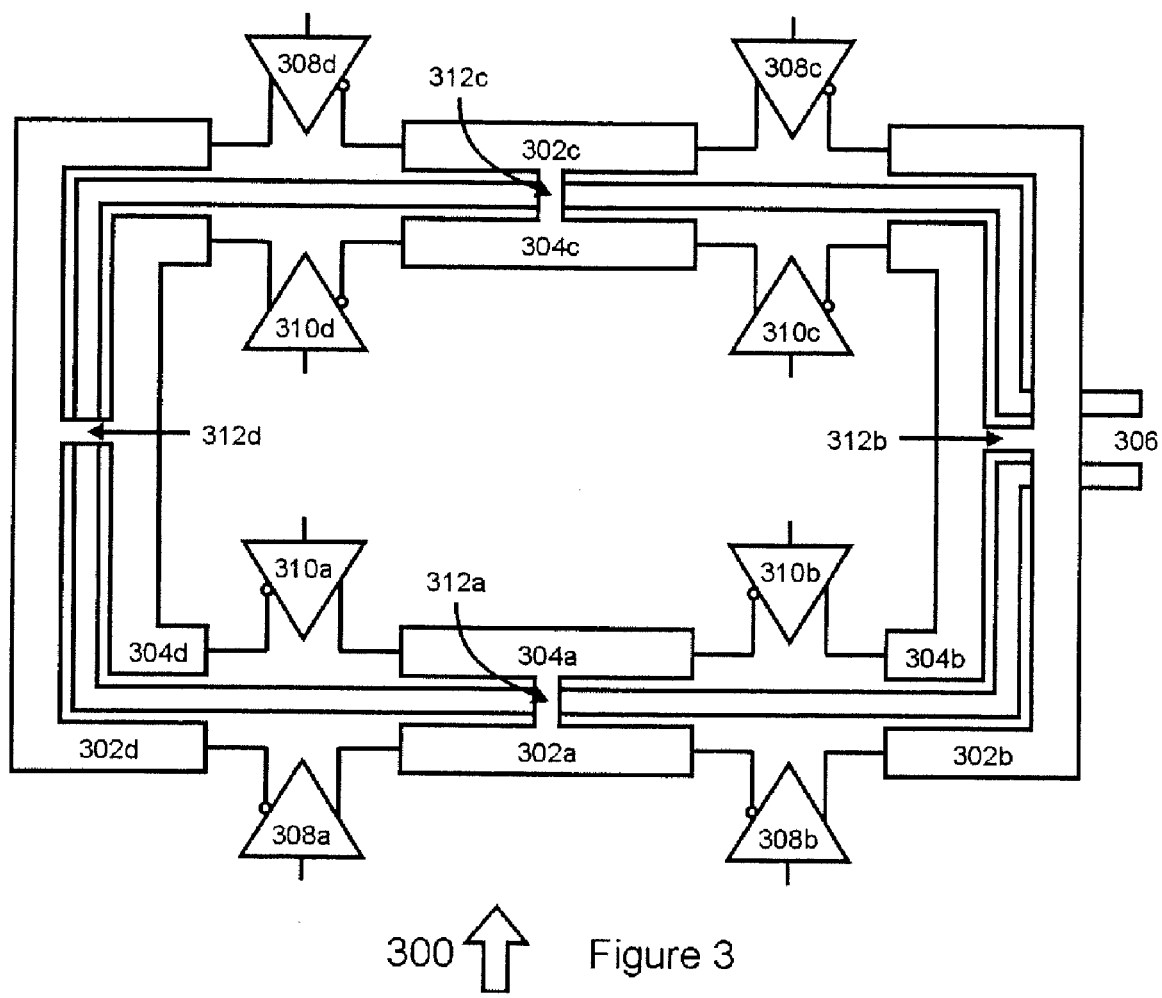
FIG. 3 is a diagram of a DAT in accordance with an exemplary embodiment of the present invention.

FIG. 3 is a diagram of DAT 300 in accordance with an exemplary embodiment of the present invention. DAT 300 includes a first primary winding 302 with inductive elements 302a through 302d, a second primary winding 304 with inductive elements 304a through 304d, and a secondary winding 306 placed so as to be magnetically coupled to both primary windings. Primary winding 302 is driven by amplifying entities 308a through 308d, and primary winding 304 is driven by amplifying entities 310a through 310d so that the inductive elements of the DAT can act as a power combiner. Furthermore, connections 312a through 312d are provided to connect primaries 302 and 304 together. The point of connection on each primary may be made at or near a virtual ground which typically exists in DAT structures at or near the center of each inductive element so as to reduce potential losses caused by ac currents at the frequency of operation which might otherwise flow through this connection. These connections may be direct or may include suitable intervening components such as inductors or active devices such as to control current through the connection or other suitable components.

The connections 312 can improve the performance of the DAT by equalizing the dc voltages on the two primaries, by allowing current to be shared between them in a similar fashion as if connections were to be made at the amplifying elements' outputs, and in other manners. Furthermore, where any mismatch in the voltage stresses due to mismatch of the DAT primaries is tolerable, providing the connection near the virtual ground of the inductive elements can be preferable to providing connections at the output of the amplifying elements because of the reduction of ac losses, as the connection between virtual grounds results in very little ac current through the connection, whereas the method of equalizing the ac voltages on two DAT primaries by connecting the outputs of their amplifying entities together relies on and can result in ac current through the connection points. In addition, making connections between the two primaries is often more easily accomplished since the virtual ground points on a given primary are typically located away from the amplifying entities on the primary. Making this connection in an area that is not near the amplifying entities reduces the difficulty of routing conductors that carry signals and currents, due to the large number of signals and high currents that are typically routed to and from the amplifying entities.

Figure 4:
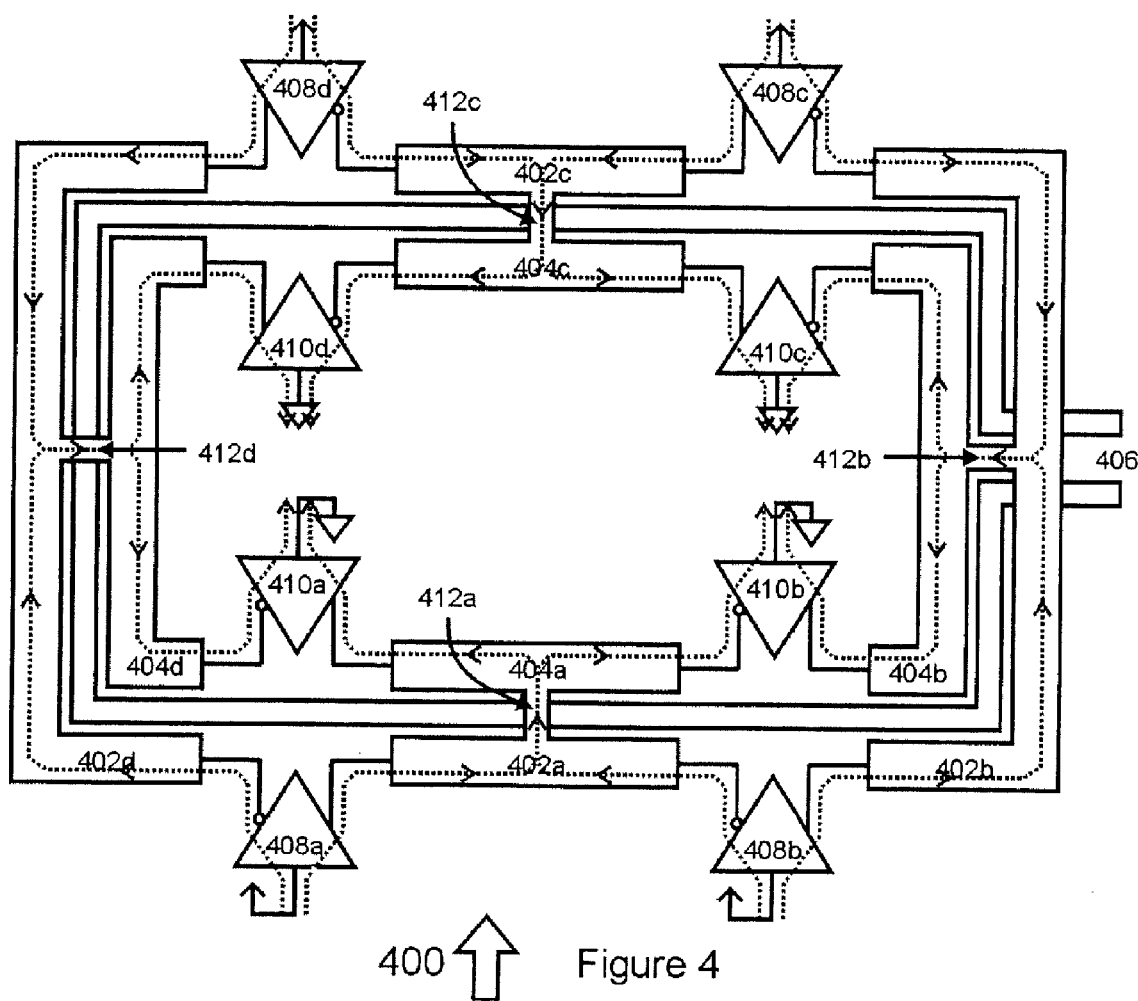
FIG. 4 is a diagram of another DAT in accordance with an exemplary embodiment of the present invention.

FIG. 4 is a diagram of DAT 400 in accordance with an exemplary embodiment of the present invention. DAT 400 includes a first primary winding 402 with inductive elements 402a through 402d, a second primary winding 404 with inductive elements 404a through 404d, and a secondary winding 406 placed so as to be magnetically coupled to both primary windings. Primary winding 402 is driven by amplifying entities 408a through 408d, and primary winding 404 is driven by amplifying entities 410a through 410d so that the inductive elements of the DAT can act as a power combiner. Furthermore, connections 412a through 412d are provided to connect primaries 402 and 404 together. These connections may be direct or may include suitable intervening components such as inductors or active devices such as to control current through the connection or other suitable components. The point of connection on each primary can be made at or near a virtual ground, which can exist in DAT structures at or near the center of each inductive element based on the configuration of the DAT structures, so as to reduce potential losses caused by ac currents at the frequency of operation which might otherwise flow through this connection.

Furthermore, the common point of each amplifying entity connected to primary 402 is provided with a dc supply, while the amplifying entities connected to primary 404 have their common points provided to a conductive path to ground. These connections can be made directly or through suitable intervening components which allow the current to pass. For instance, inductors can be used to allow dc current to pass, or control circuits can be employed in these paths to control the amount of the supply current that is allowed to pass through the amplifying entities.

A benefit of making the supply connections in this way is that the dc current consumed by the amplifying entities connected to primary 402 is shared with those connected to primary 404 in a similar fashion as DAT 200. The shared current in this case can conduct through the DAT primary inductive elements over the paths depicted by the dashed lines. If the amplifying entities are appropriately matched to one another, the dc voltage drop across each amplifying entity can be limited, such as to nearly half of what it would be if the entire supply were to be applied across each amplifying entity individually. As a result, a higher supply voltage can be utilized without undue losses of power which can result from other methods of reducing the dc voltage across the amplifying entities. Other suitable supply voltages can also or alternatively be applied in a similar manner, such as a positive and a negative supply voltage. Furthermore, other configurations of primaries may be employed such as that the relative placement of the two primaries 402 and 404 depicted in FIG. 4 may be such that primary 402 may be located inside of primary 404 or other suitable configurations.

Relative to the system and method utilized for DAT 200 wherein the connections are made at the outputs of the amplifying entities, this method and configuration of connecting at the virtual ground points can result in lower ac losses due to the typically lower levels of ac current which pass through the connection. It should be noted, though, that higher dc losses may result as the dc current between the various amplifying entities is conducted through the parasitic resistance of the DAT inductive elements. Furthermore, the connection may not provide the benefit of balancing the ac voltages on the two primaries at the fundamental frequency of operation. The exemplary amplifying entities of FIGS. 2b through 2g can also or alternatively be used in conjunction with DAT 400 where suitable.

Figure 5:
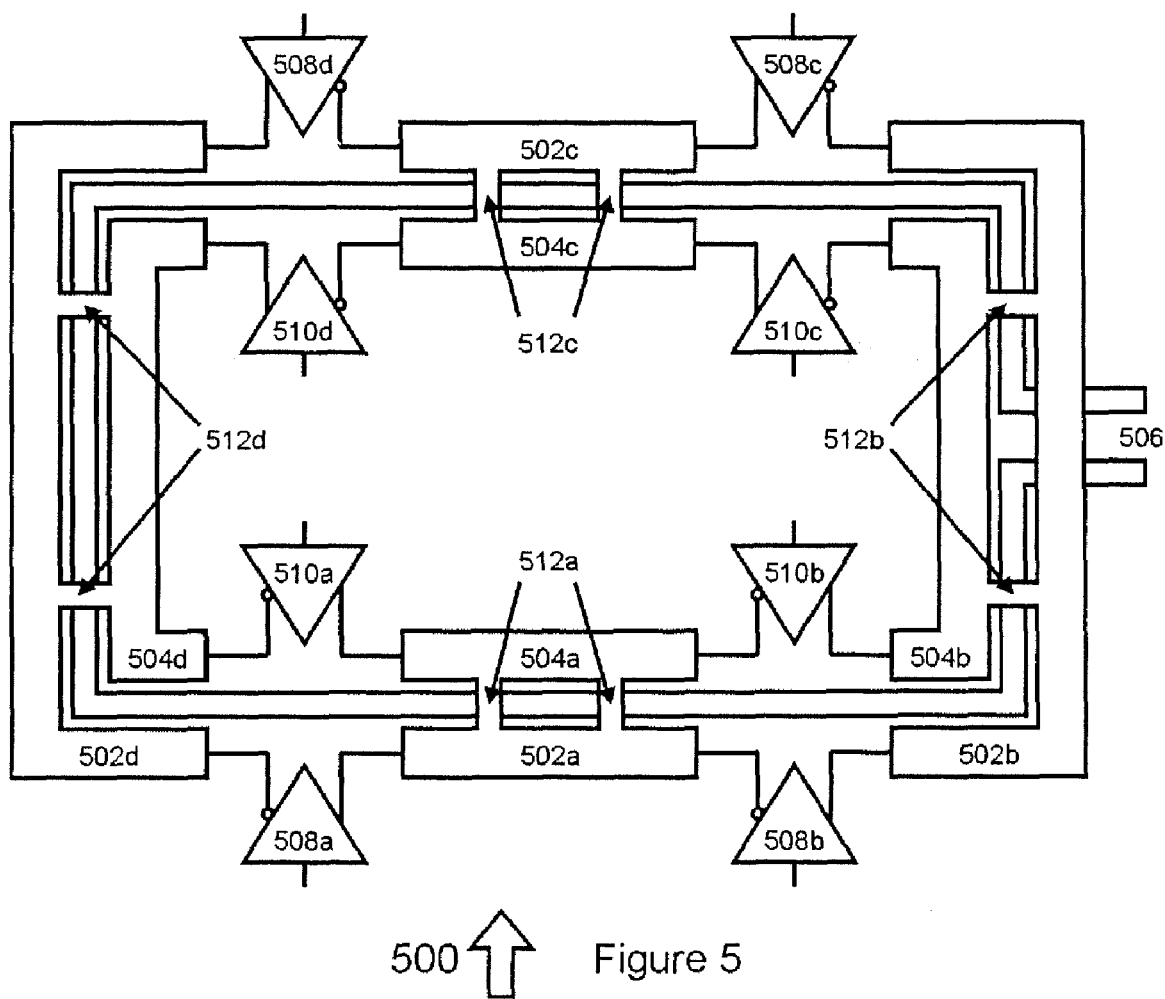
FIG. 5 is a diagram of a further DAT in accordance with an exemplary embodiment of the present invention.

FIG. 5 is a diagram of DAT 500 in accordance with an exemplary embodiment of the present invention. DAT 500 includes a first primary winding 502 with inductive elements 502a through 502d, a second primary winding 504 with inductive elements 504a through 504d, and a secondary winding 506 placed so as to be magnetically coupled to both primary windings. Primary winding 502 is driven by amplifying entities 508a through 508d, and primary winding 504 is driven by amplifying entities 510a through 510d so that the inductive elements of the DAT can act as a power combiner. Furthermore, connections 512a through 512d are provided to connect primaries 502 and 504 together. Connections 512a through 512d can be made between the inductive elements of primary 502 and 504 in such a way that two connections are made between adjacent inductive elements of the two primaries at points which are substantially equidistant from the location of the virtual ground near the center of the inductive element to which the connection is made. These connections may be direct or may include suitable intervening components such as inductors or active devices such as to control current through the connection or other suitable components.

This location of the connection points can help to achieve a trade-off between the relative advantages and disadvantages of forced synchronization such as is achieved using the connection points of DAT 100 and connection at the virtual ground locations as in DAT 300. There can be less dc power loss compared to a center connection as the dc current path is shorter. There can be more equalization of ac voltage stresses compared to connection at the center connection at the virtual grounds. Additionally, there can be less ac losses than a connection at the outputs of the amplifying entities near the ends of the inductive elements.

Furthermore, there can be more flexibility in the layout since the connections are not required to be exactly at the point at which a virtual ground exists. In the event that the advantages of a connection at the center near the virtual grounds is desired but becomes difficult due to other considerations, two connections located symmetrically equidistant from the virtual ground will typically be advantageous relative to a single off-center connection, which can result in undesirable imbalances and typically higher second harmonic generation.

Figure 6:
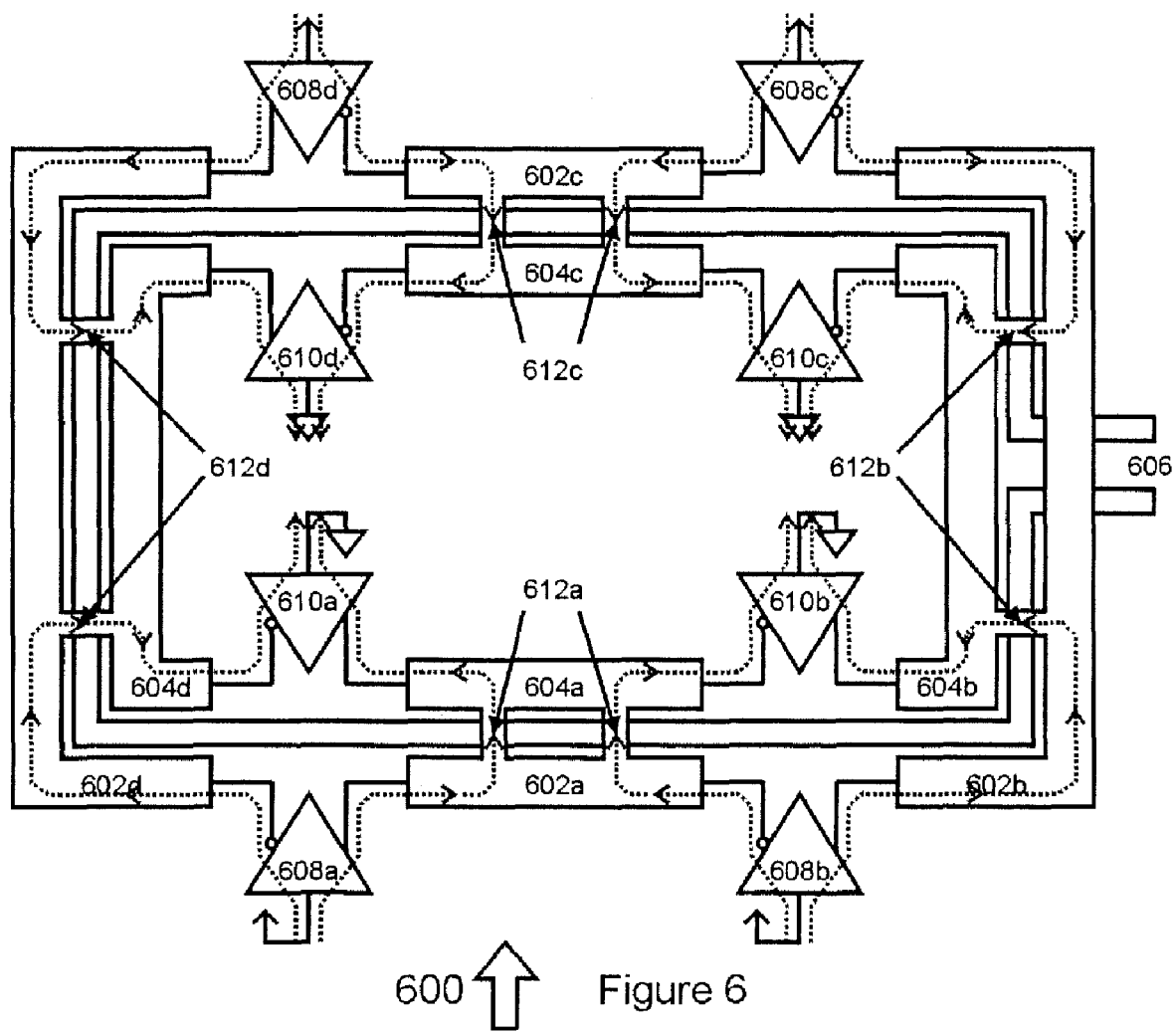
FIG. 6 is a diagram of another DAT in accordance with an exemplary embodiment of the present invention.

FIG. 6 is a diagram of DAT 600 in accordance with an exemplary embodiment of the present invention. DAT 600 includes a first primary winding 602 with inductive elements 602a through 602d, a second primary winding 604 with inductive elements 604a through 604d, and a secondary winding 606 placed so as to be magnetically coupled to both primary windings. Primary winding 602 is driven by amplifying entities 608a through 608d, and primary winding 604 is driven by amplifying entities 610a through 610d so that the inductive elements of the DAT can act as a power combiner. Furthermore, connections 612a through 612d are provided to connect primaries 602 and 604 together. The point of connection on each primary can be made at or near a virtual ground, which can exist in DAT structures at or near the center of each inductive element depending on the DAT configuration, so as to reduce potential losses caused by ac currents at the frequency of operation which might otherwise flow through this connection. These connections may be direct or may include suitable intervening components such as inductors or active devices such as to control current through the connection or other suitable components.

Furthermore, the common points of each amplifying entity connected to primary 602 are provided to a dc supply, while the amplifying entities connected to primary 604 have their common points provided to a conductive path to ground. These connections may be made directly or through suitable intervening components which allow the current to pass. For instance, inductors can be used to allow dc current to pass, or control circuits can be employed in these paths to control the amount of the supply current that is allowed to pass through the amplifying entities.

The benefits of making the supply connections in this configuration include that the dc current consumed by the amplifying entities connected to primary 602 is shared with the amplifying entities connected to primary 604 in a similar fashion as DAT 200. The shared current in this case can conduct through the DAT primary inductive elements over the paths depicted by the dashed lines. If the amplifying entities are appropriately matched to one another, the dc voltage drop across each amplifying entity can be limited, such as to nearly half of what it would be if the entire supply were to be applied across each amplifying entity individually. As a result, a higher supply voltage can be utilized without undue losses of power which can result from other methods of reducing the dc voltage across the amplifying entities. Other suitable supply voltages can also or alternatively be applied in a similar manner, such as a positive and a negative supply voltage. Furthermore, other configurations of primaries may be employed such as that the relative placement of the two primaries 602 and 604 depicted in FIG. 6 may be such that primary 602 may be located inside of primary 604 or other suitable configurations.

Relative to the system and method utilized for DAT 200 wherein the connections are made at the outputs of the amplifying entities, this method and configuration of connecting at the virtual ground points can result in lower ac losses due to the typically lower levels of ac current which pass through the connection. It should be noted, though, that higher dc losses may result as the dc current between the various amplifying entities is conducted through the parasitic resistance of the DAT inductive elements. Furthermore, the connection may not provide the benefit of balancing the ac voltages on the two primaries at the fundamental frequency of operation. The exemplary amplifying entities of FIGS. 2b through 2g can also or alternatively be used in conjunction with DAT 600 where suitable.

Figure 7:
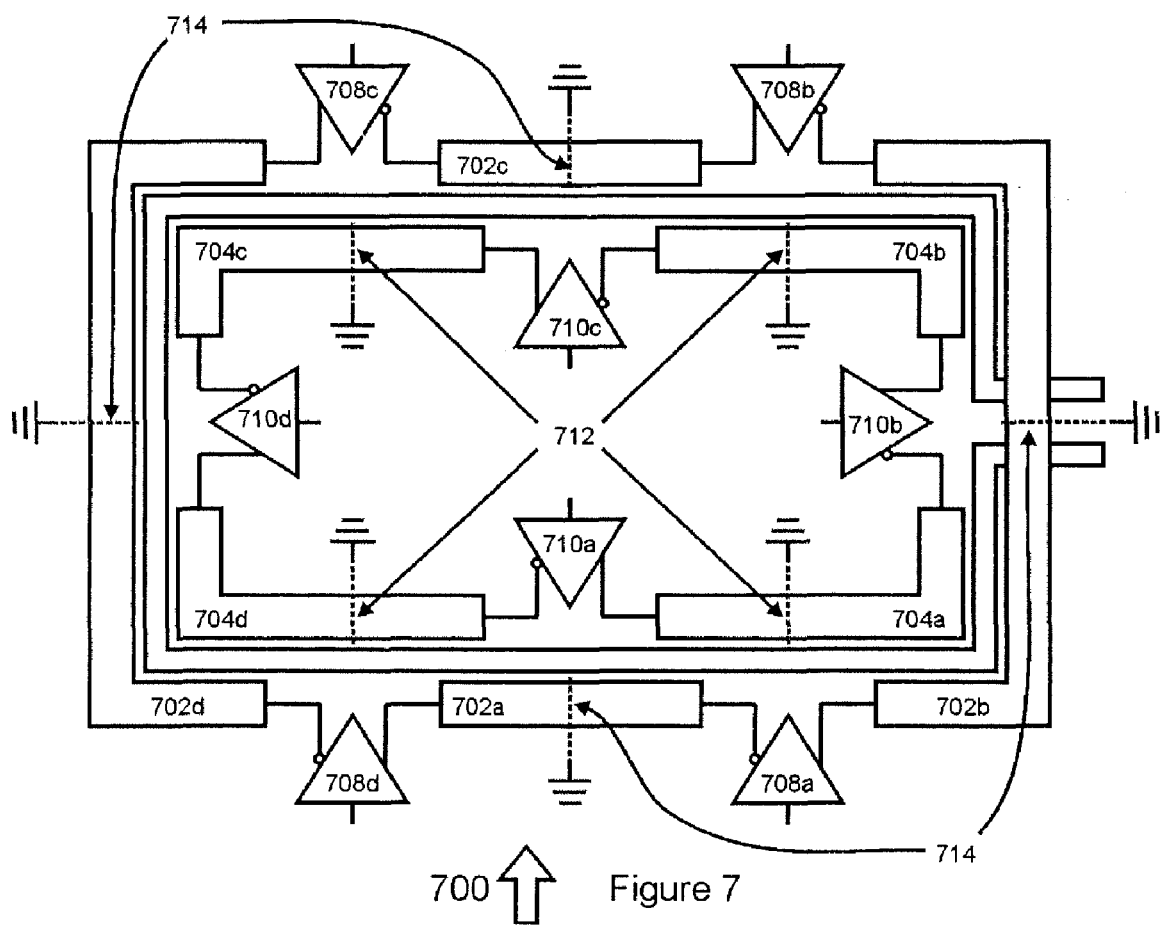
FIG. 7 is a diagram of a DAT with offset amplifying entities (offset DAT) in accordance with an exemplary embodiment of the present invention.

FIG. 7 is a diagram of DAT 700 with offset amplifying entities (offset DAT) in accordance with an exemplary embodiment of the present invention. The location of amplifying entities 708a through 708d on outer primary winding 702 are offset from the locations of amplifying entities 710a through 710d on inner primary winding 704 at a suitable offset, such as based on available space, to reduce losses, to optimize the location of connections to $V_{dd}$ or GND, to facilitate routing of conductors for input and control signals to each amplifying entity, or for other suitable purposes. The magnetic coupling between the inductive elements 702a through 702d of the outer primary winding 702 and the inductive elements 704a through 704d of the inner primary winding 704 to the secondary winding 706 and the loop currents determine the output of secondary winding 706, thereby combining the outputs of the amplifying entities to be delivered to the load.

One beneficial offset configuration is where the amplifying entities 708a through 708d are connected to primary 702 in proximity with the virtual grounds 712 near the centers of the inductive elements of primary 704. This configuration can also result in the amplifying entities 710a through 710d being connected to primary 704 in proximity with the virtual grounds 714 located near the centers of the inductive elements of primary 702. This connection can allow for advantageous connections between the virtual grounds and the amplifying entities, e.g., where the dc voltage of inductive element 702c is used to supply bias circuits connected to amplifying entity 710c. Because the connection point made to inductive element 702c is at its virtual ground, the connection can have minimal undesirable effects from ac currents induced in the connection, or from the coupling of ac voltage into the connection.

Aside from enabling useful connections to the DAT elements, locating the amplifying entities near the virtual grounds as shown in DAT 700 can also reduce capacitive coupling between the primaries and conductors carrying control and bias lines which may have to be routed to the amplifying entity across the inductive element. For instance, conductors for control connections to amplifying entity 708d may need to be routed to a circuit located in the center of DAT 700. By placing the virtual ground of inductive element 704c in proximity to amplifying entity 708c, the conductor for the signal can be routed through the virtual ground, greatly reducing the undesirable capacitive coupling between the conductor for control line and the inductive element.

Figure 8:
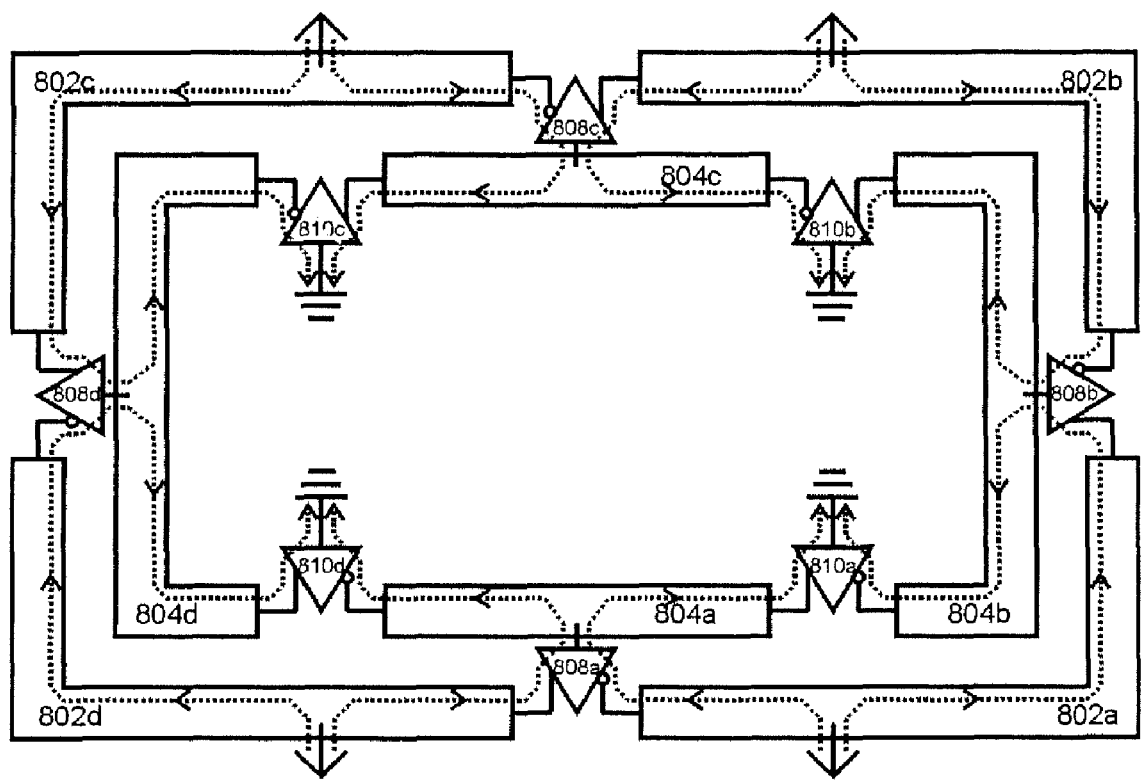
FIG. 8 is a diagram of an offset DAT in accordance with an exemplary embodiment of the present invention.

FIG. 8 is a diagram of offset DAT 800 in accordance with an exemplary embodiment of the present invention. The location of amplifying entities 808a through 808d on outer primary winding 802 are offset from the locations of amplifying entities 810a through 810d on inner primary winding 804 at a suitable offset, such as based on available space, to reduce losses, to optimize the location of connections to $V_{dd}$ or GND, to facilitate routing of conductors for input and control signals to each amplifying entity, or for other suitable purposes. The magnetic coupling between the inductive elements 802a through 802d of the outer primary winding 802 and the inductive elements 804a through 804d of the inner primary winding 804 to the secondary winding (not explicitly shown) and the loop currents determine the output of the secondary winding, thereby combining the outputs of the amplifying entities to be delivered to the load.

DAT 800 also includes a dc supply voltage applied to the amplifying entities 808a through 808d, such as at the virtual ground points of the inductive elements 802 or through some other suitable inductor or conducting element. A conductive path to ground is provided for each of the amplifying entities 810a through 810d, such as directly, through a suitable inductor, or through another conductive path. Additionally, each amplifying entity 808a through 808d has its common node connected to or near to the virtual ground of the adjacent inductive element 804.

Implementing these dc connections in this manner can reduce the dc voltage applied to each of the amplifying entities by sharing the dc currents of amplifying entities 808a through 808d in series with the amplifying entities 810a through 810d along the path shown in dotted lines, so that each can be made to receive approximately half of the total supply voltage. Furthermore, the connections between amplifying elements 808a through 808d and inductive elements 804a through 804d can be made at the virtual grounds of the inductive elements, such that the connection can result in little additional ac losses or detrimental ac interference between primary 804 and amplifying entities 808a through 808d. Other suitable supply voltages can also or alternatively be applied in a similar manner, such as a positive and a negative supply voltage. Furthermore, other configurations of primaries may be employed such as that the relative placement of the two primaries 802 and 804 depicted in FIG. 8 may be such that primary 802 may be located inside of primary 804 or other suitable configurations.

Figure 2B:
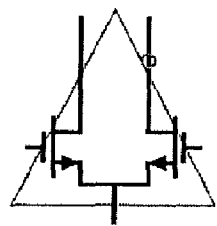
Figure 2C:
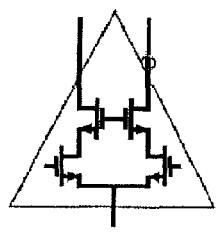
Figure 2D:
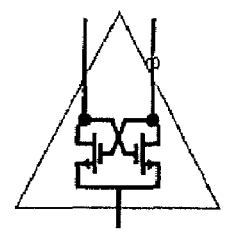
Figure 2E:
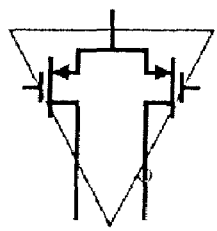
Figure 2F:
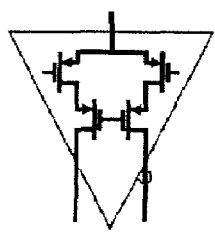
Figure 2G:
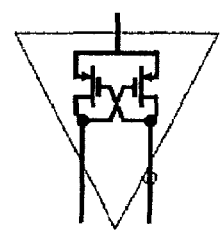

This technique is particularly advantageous in cases wherein it is desirable to use only n-type devices such as NMOS transistors or NPN bipolar transistors, such as, for example, the amplifiers depicted in FIG. 2b and FIG. 2c and the oscillator of FIG. 2d. Since bias and control signals such as amplifier inputs must typically be applied at voltage levels higher than the common voltage, DAT 800 allows amplifying entities to be composed of n-type devices since all of the common nodes of amplifying entities 808a through 808d and 810a through 810d are at most approximately half the supply voltage, making generation of higher voltages less difficult than if voltages outside of the supply range were to be required. By way of counter-example, amplifying entity 208a in FIG. 2a has its common point connected to the supply voltage, so that if this amplifying entity were to be implemented with n-type devices, generation of appropriate bias and control voltages—which would typically be even higher than the supply—might prove difficult.

Since n-type and p-type devices in any given technology or process can have differences in performance, architectures such as DAT 800 can be used to enable use of only one of the device types, which can be advantageous over architectures that are implemented using both types of devices. For example, in an exemplary sub-micron CMOS technology, NMOS transistors can have a higher cut-off frequency ($f_T$) or higher channel conductivity than PMOS transistors, such that DAT 800 with NMOS transistors can achieve higher power efficiency or operate at a higher frequency than one employing both p-type and n-type devices. This architecture can be generalized to multiple levels of devices, which can be useful such as for using low voltage devices to make a power amplifier for a high voltage power supply or in other suitable applications.

Figure 9:
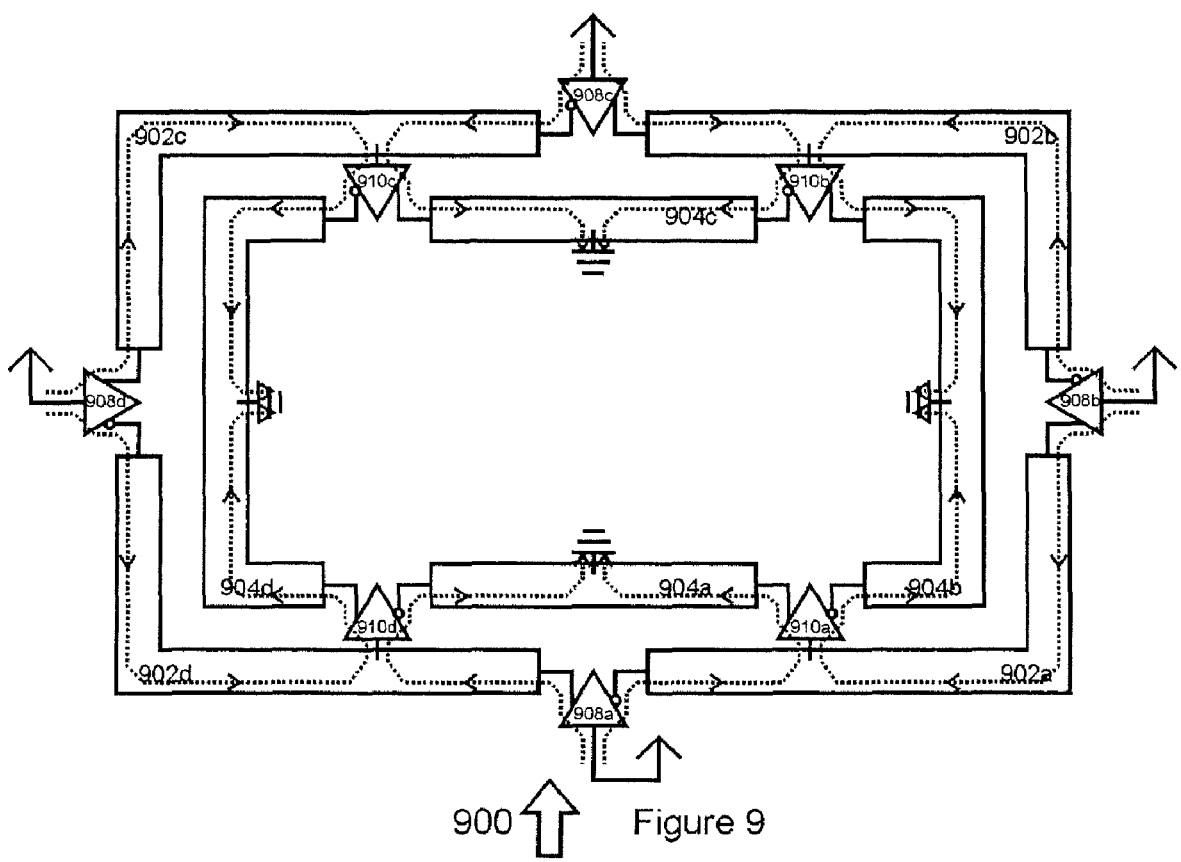
FIG. 9 is a diagram of an offset DAT in accordance with an exemplary embodiment of the present invention.

FIG. 9 is a diagram of offset DAT 900 in accordance with an exemplary embodiment of the present invention. The location of amplifying entities 908a through 908d on outer primary winding 902 is offset from the location of amplifying entities 910a through 910d on inner primary winding 904 at a suitable offset, such as based on available space, to reduce losses, to optimize the location of connections to $V_{dd}$ or GND, to facilitate routing of conductors for input and control signals to each amplifying entity, or for other suitable purposes. The magnetic coupling between the inductive elements 902a through 902d of the outer primary winding 902 and the inductive elements 904a through 904d of the inner primary winding 904 to the secondary winding (not explicitly shown) and the loop currents determine the output of secondary winding, thereby combining the outputs of the amplifying entities to be delivered to the load.

DAT 900 also includes a dc supply voltage applied to the common points of amplifying entities 908a through 908d, such as directly, through a suitable inductor, or through another conductive path. A conductive path to or near to a virtual ground point on inductive elements 902a through 902d is provided for each of the amplifying entities 910a through 910d, such as directly, through a suitable inductor, or through another conductive path. Additionally, each inductive element 904a through 904d is connected to ground, such as at the virtual ground points near their centers. These ground connections may be direct, through a suitable inductor, or through another conducting path.

Implementing these dc connections in this manner can reduce the dc voltage applied to each of the amplifying entities by sharing the dc currents of amplifying entities 908a through 908d in series with the amplifying entities 910a through 910d along the path shown in dotted lines, so that each may be made to receive approximately half of the total supply voltage. Furthermore, the connections between amplifying elements 910a through 910d and inductive elements 902a through 902d can be made at the virtual grounds of the inductive elements, such that the connection can result in little additional ac losses or detrimental ac interference between primary 902 and amplifying entities 910a through 910d. Other suitable supply voltages can also or alternatively be applied in a similar manner, such as a positive and a negative supply voltage. Furthermore, other configurations of primaries may be employed such as that the relative placement of the two primaries 902 and 904 depicted in FIG. 9 may be such that primary 902 may be located inside of primary 904 or other suitable configurations.

Furthermore, using amplifying entities with p-type devices, such as those shown in FIGS. 2b through 2d, may provide additional robustness against device failure or allow operation at higher voltage levels as p-type devices can in many processes have the advantage of higher breakdown voltage than similar n-type devices.

Figure 10:
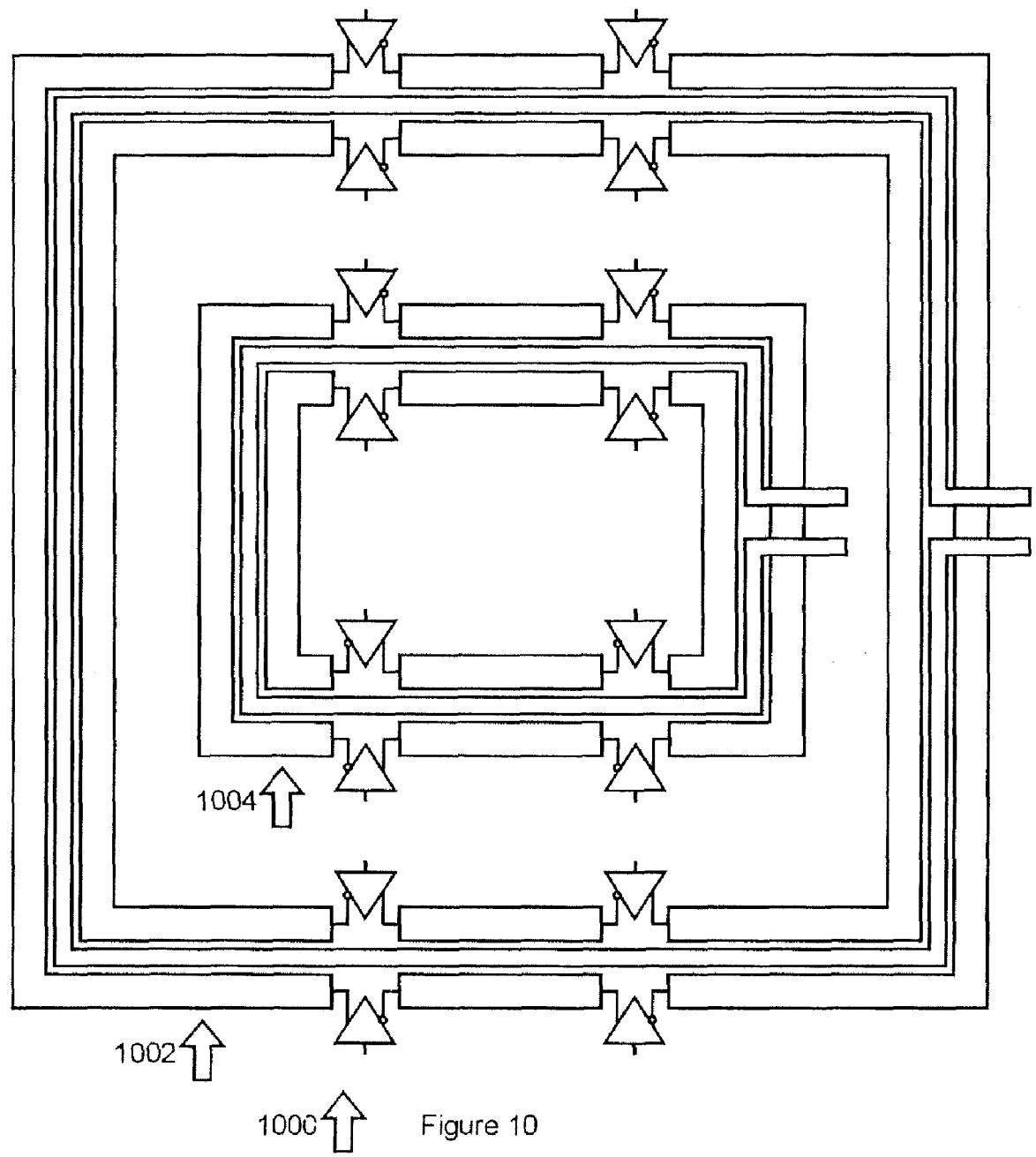
FIG. 10 is a diagram of concentric DAT in accordance with an exemplary embodiment of the present invention.

FIG. 10 is a diagram of concentric DAT 1000 in accordance with an exemplary embodiment of the present invention. Concentric DAT 1000 includes DAT 1004 placed within the center area of DAT 1002, which can be used to reduce the chip area required when two DATs are used, while maintaining the performance of each DAT. For instance, in applications requiring output power to be generated at two different frequencies, a larger first DAT may be implemented to operate at the lower frequency while a smaller second DAT may be implemented to operate the higher frequency and be located in the typically otherwise empty area located inside of the first DAT. This application is particularly suitable for concentric DAT structures where the optimal size for a higher frequency DAT is typically smaller than the optimum size for a lower frequency one, so that each DAT may in principle reach nearly optimal performance while saving substantial area.

Alternatively, if operation at the same frequency is desired but at two different power levels, a larger DAT may be designed which may be the optimal size for that frequency to operate at the power level for which efficiency is deemed more critical. Inside of this DAT, a smaller less-optimized DAT may be placed to enable operation at the second power level with little or no increase in circuit area.

Likewise, this configuration can be expanded to encompass multiple DATs operating at different frequencies and power levels, as well as using side-by-side DATs or other suitable configurations. While the individual DATs of DAT 1000 can operate individually (one at a time), this structure can also be used to allow DAT 1002 and DAT 1004 to operate simultaneously, such as at multiple frequencies, resulting in a concurrent power amplifier.

Figure 11A:
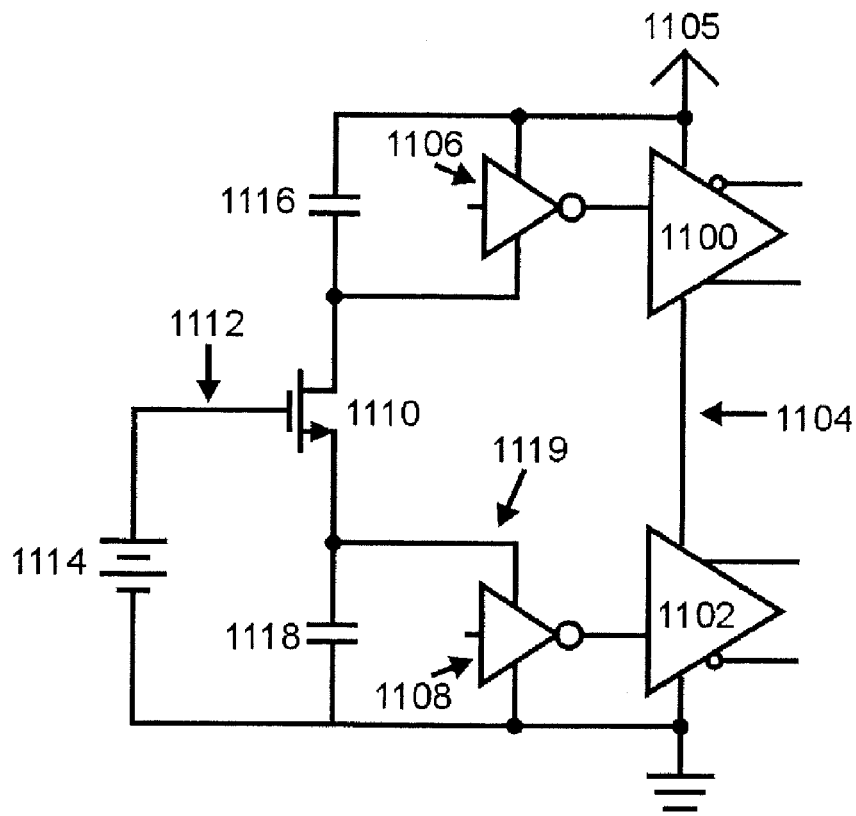
FIG. 11a is a diagram of a supply sharing circuit for driver circuits in accordance with an exemplary embodiment of the present invention.

FIG. 11a is a diagram of a supply sharing circuit for driver circuits in accordance with an exemplary embodiment of the present invention. In this supply sharing circuit, amplifiers 1100 and 1102 are configured to operate in series with respect to dc supply 1105 so that supply current flows through amplifier 1100, through a path represented by connection 1104, and then through amplifier 1102 to ground. In this manner, each amplifier can be subjected to a voltage that is less than the supply voltage 1105. Furthermore, if the amplifiers and their loads are suitably matched, each amplifier can be operated with a dc voltage across its supply terminals that is approximately half of the supply voltage 1105, so that the connection point 1104 has a dc voltage that is approximately one half of the supply voltage 1105. Although for ease of description the connection point 1104 is represented in FIG. 11a as a single connection which is separate from other connections having different functions, in many practical cases the connection path by which the supply current is shared between amplifiers 1100 and 1102 can include multiple paths. Furthermore, the connection path can be through circuit nodes which also serve a separate function, such as an output or a common point of a differential amplifier. By way of example, if the circuit of FIG. 2a is configured so that the amplifying entities are implemented using amplifier circuits, the amplifiers 208d and 210d share their supply currents in a series manner. The sharing is, however, through two separate paths denoted in the dashed lines, and furthermore, the points at which the amplifiers connect to these paths also serve the function of the amplifiers' outputs. The present invention can be advantageously utilized for amplifier circuits which share dc supply current in a suitable number of paths and also for circuits which share current through paths which include circuit nodes with additional functions.

Driver circuits 1106 and 1108 provide input signals to amplifiers 1100 and 1102 respectively. These driver circuits share their dc supply currents in series in a manner similar to amplifiers 1100 and 1102, through transistor 1110. If the driver circuits and their loads are appropriately matched to each other, the dc voltage drop across each supply connection can approximately equal the dc voltage drop across the supply terminals of the other. Furthermore, by sharing their currents in series, the total current provided from the supply 1105 to the driver circuits can be substantially less than if the two drivers take current from the supply separately in parallel current paths. Although FIG. 11a shows only a single driver circuit providing input to each amplifier, the present invention can be advantageously applied in cases wherein driver circuits supply multiple inputs to amplifiers, such as by providing differential or complementary signals. Furthermore, each driver circuit can comprise several circuits having various functions which have their supply terminals connected in parallel to each other.

A gate signal 1112 can be applied to transistor 1110 so as to control the total dc voltage to which the supply terminals of drivers 1106 and 1108 are subjected. Transistor 1110 can control the supplies of both driver circuits simultaneously by appropriately restricting the current path between the driver circuits, thereby dropping varying amounts of voltage across its terminals. The driver circuits can utilize the remainder of the supply voltage 1105, each having approximately half of that part of supply voltage 1105 which transistor 1110 and any other intervening circuitry is not dropping. A control voltage 1114 or other suitable control circuit can be used to control the gate voltage 1112 to regulate the supply voltages available to driver circuits 1106 and 1108, such as to reduce sensitivity to changes or variation of supply voltage 1105, to compensate for changes in temperature, or for other suitable purposes.

In order to further stabilize the voltages applied to the supply terminals of the drivers, capacitors 1116 and 1118 can be connected across the supply terminals of driver circuits 1106 and 1108 respectively. These capacitors can reduce time-varying supply variations which occur too fast for the transistor 1110 and its control circuit to compensate. Furthermore, these capacitors can reduce interference from amplifiers 1100 and 1102 by reducing the amount of ac voltage induced in the driver supplies at the frequency of the amplifier's operation and at harmonic frequencies.

In one exemplary embodiment, appropriate control signals are provided to gate 1112 so as to regulate the driver circuit's supply voltages, to implement transistor 1110 as an n-type transistor such as an NMOS device, and to supply the gate signal with a fixed voltage relative to ground. In this manner, transistor 1110 can act as a source follower device, and so will tend to regulate the voltage at node 1119 relative to ground, which is the dc supply voltage applied to driver circuit 1108. If the driver circuit 1106 is appropriately matched to driver circuit 1108, the supply voltage dropped by driver circuit 1106 may be approximately the same as the supply voltage used by driver circuit 1108 and so the dc supply voltage applied to driver circuit 1106 is similarly regulated.

Figure 11B:
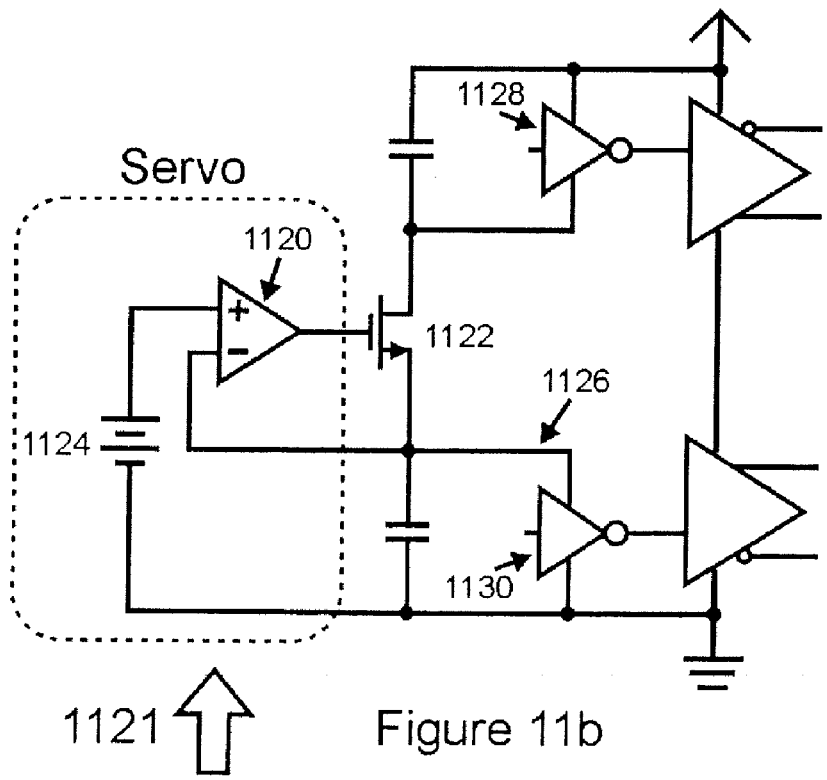
FIG. 11b is a diagram of an alternative circuit to control regulation of the driver supply in accordance with an exemplary embodiment of the present invention.

FIG. 11b is a diagram of an alternative circuit to control regulation of the driver supply in accordance with an exemplary embodiment of the present invention. This circuit utilizes a servo mechanism with reference voltage 1124 and an error amplifier 1120, such as an operational amplifier, which controls the gate of the regulating transistor 1122. The error amplifier receives reference voltage 1124 and a feedback voltage 1126. The amplifier can correct for variation in voltage 1126 by sensing the difference between the voltage of node 1126 relative to voltage 1124 and modifying the gate signal applied to transistor 1122 so as to set the voltages equal to each other. Alternatively, other feedback configurations can be used to set the voltages to be proportional to each other or in other relations to each other. Since node 1126 is also the supply voltage of driver circuit 1130, the servo circuit serves to regulate the supply voltage applied to driver circuit 1130. Furthermore, if driver 1128 is appropriately matched to driver 1130, the supply voltage applied to driver 1128 can be similarly regulated.

Figure 12:
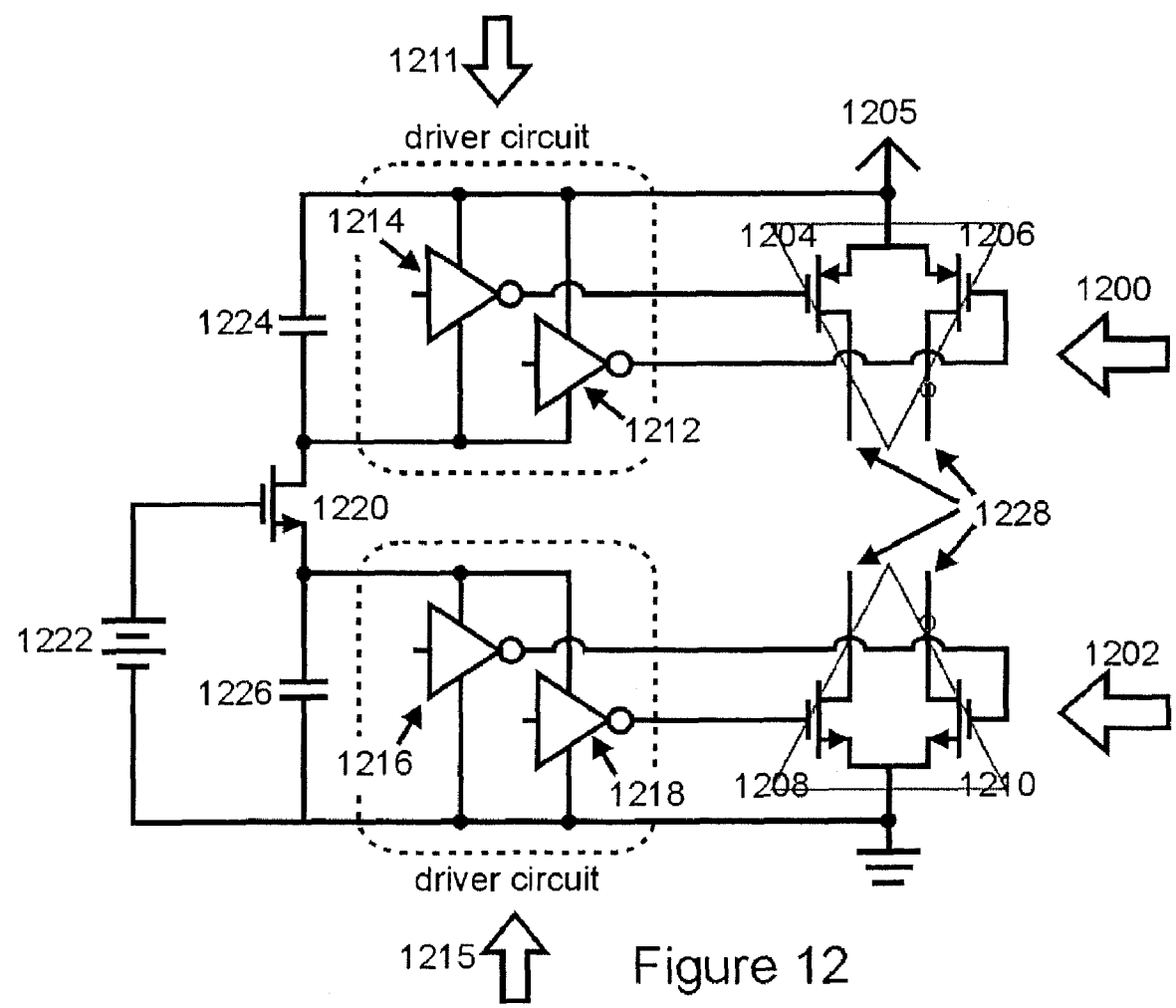
FIG. 12 is a diagram of amplifiers in accordance with an exemplary embodiment of the present invention.

FIG. 12 is a diagram of a supply sharing circuit for driver circuits in accordance with an exemplary embodiment of the present invention. Amplifier 1200 is implemented as a complementary amplifier similar to the amplifier of FIG. 2e, having transistors 1204 and 1206 which are driven in a complementary fashion to produce complementary outputs at their drains. Amplifier 1202 is implemented as a complementary amplifier similar to the amplifier of FIG. 2b, having transistors 1208 and 1210 which are driven in a complementary fashion to produce complementary outputs at their drains. The inputs of amplifier 1200 are provided by a driver circuit 1211 comprising driver 1214 and driver 1212, which drive the gates of transistors 1204 and 1206, respectively. The inputs of amplifier 1202 are provided by a driver circuit 1215 comprising driver 1218 and driver 1216, which drive the gates of transistors 1208 and 1210, respectively. Amplifiers 1200 and 1202 together provide four output nodes 1228, which can be connected to an appropriate DAT such as in, for example, FIG. 2a, FIG. 4, and FIG. 6. Alternatively the outputs can be combined in other suitable ways or used separately. Furthermore, amplifiers 1200 and 1202 can be implemented using other suitable complementary circuits, such as cascode amplifiers depicted in FIG. 2c and FIG. 2f or other suitable circuits.

Figure 13A:
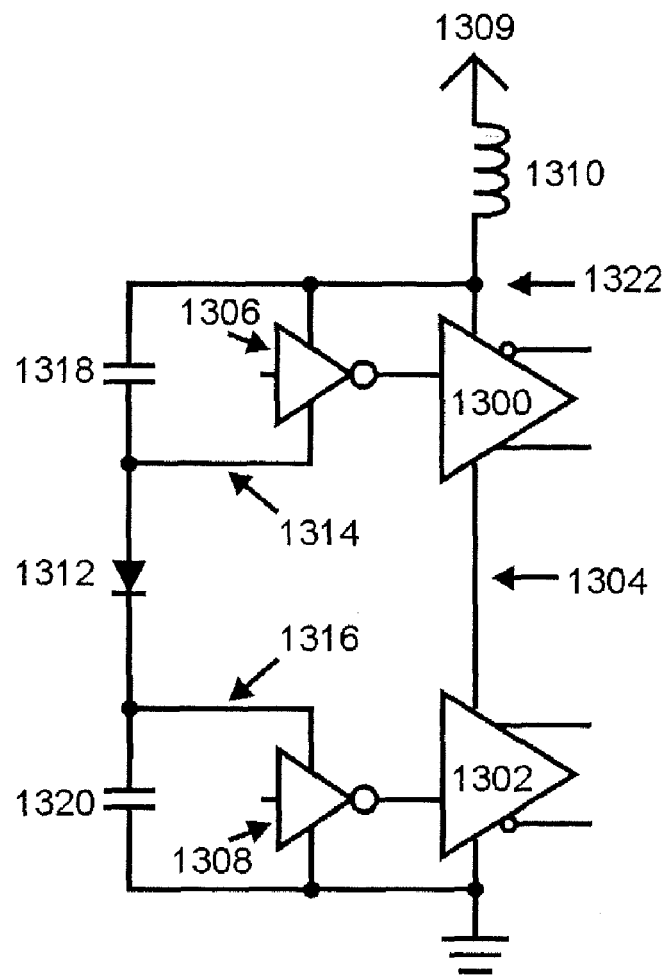
FIGS. 13a and 13b are diagrams of a supply sharing circuit for driver circuits in accordance with an exemplary embodiment of the present invention.
Figure 13B:
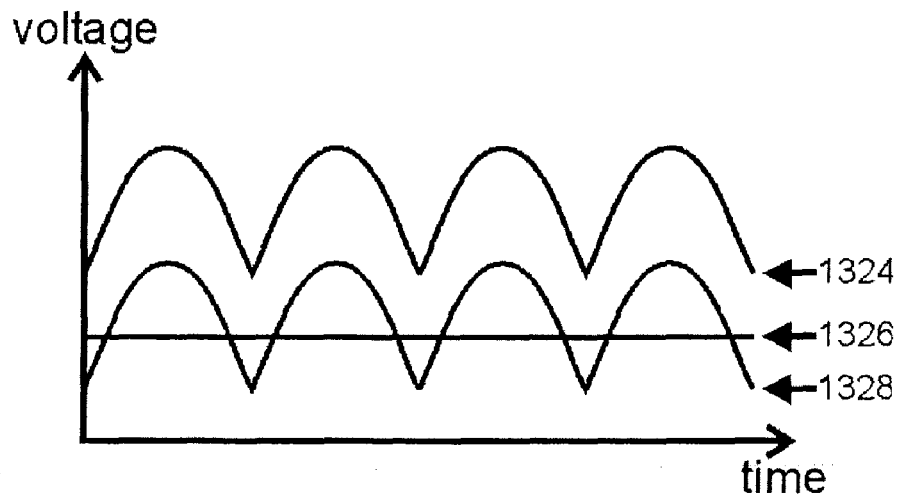

FIGS. 13a and 13b are diagrams of a supply sharing circuit for driver circuits in accordance with an exemplary embodiment of the present invention. Between the supply voltage 1309 and the supply connection of amplifier 1300 located at node 1322 is inductance 1310, which may be parasitic or added for some function, such as to act as a choke. Due to ac currents passing through inductor 1310, an ac voltage may be generated on node 1322 superimposed on the dc voltage imposed by supply 1309. An example of a typical voltage waveform 1324 which might occur is depicted in FIG. 13b.

This ac voltage ripple can cause problems in the supply circuits for drivers 1306 and 1308 if precautions are not taken. Consider the waveforms depicted in FIG. 13*b*, depicting typical desirable waveforms in the case of an ac-corrupted supply for nodes 1322, 1314, and 1316 which are the ac-corrupted supply, the supply for driver 1306, and the supply for driver 1308, respectively. As noted before, waveform 1324 consists of the desired dc supply voltage in addition to ac interference signals. Driver 1306 may require an approximately constant supply across its terminals, and so the desired waveform 1328 may be required to track the ac ripple of waveform 1324 so that the difference between 1328 and 1324 is approximately constant. The supply applied to driver 1308, however, is referenced to ground and thus the voltage waveform 1326 at 1316 should ideally be a constant voltage. Due to the ac voltage on node 1314, it is possible that the time-varying voltage on node 1316 may become temporarily greater than the voltage on node 1314, possibly resulting in the flow of current from node 1316 into node 1314. For instance, if the control circuit of FIG. 11*a* were to be used, transistor 1110 would conduct current from source to drain during these times, potentially resulting in voltage ripple on the two driver supplies. To reduce this effect, a rectifying device 1312 such as a diode or a diode-connected MOSFET can be placed in series with the current path between the supply nodes 1314 and 1316 of the drivers, to eliminate or reduce any current from node 1316 to node 1314 during times when the voltage at node 1314 becomes temporarily less than that at node 1316.

Furthermore, capacitors 1318 and 1320 can be placed across the supply terminals of drivers 1306 and 1308 respectively. In addition to supply filtering effects that these capacitors may provide, capacitors 1318 and 1320 can also temporarily source the current to drivers 1306 and 1308 during times when rectifying device 1312 is reverse biased so that the driver currents cannot be taken from supply 1309. Thus, capacitors 1318 and 1320 can accumulate and store charge during times when rectifying device 1312 is forward biased, to be used as driver supply current during the times when the rectifying device 1312 is reverse biased.

Figure 14:
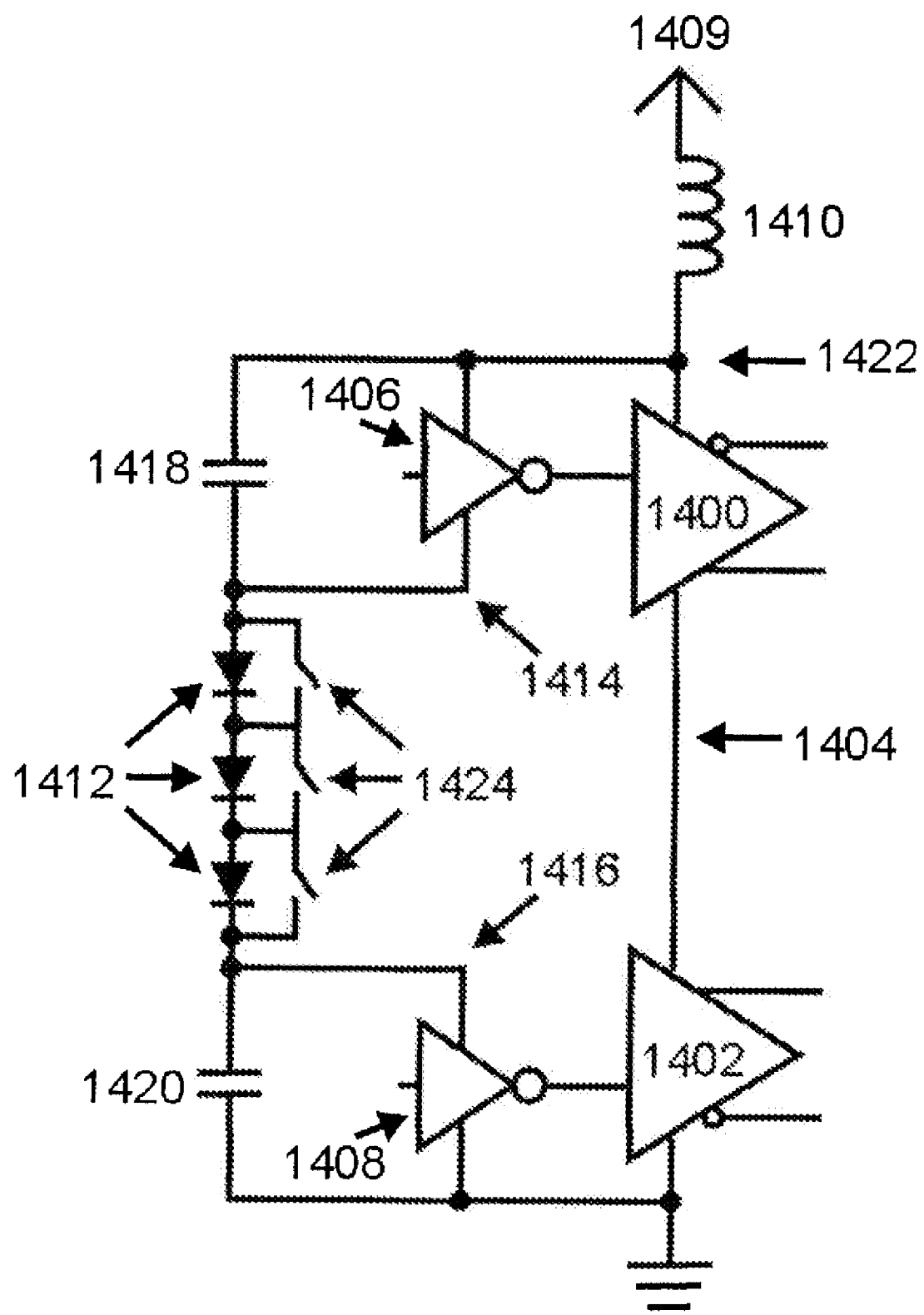
FIG. 14 is a diagram of a supply sharing circuit for driver circuits in accordance with an exemplary embodiment of the present invention.

FIG. 14 is a diagram of a supply sharing circuit for driver circuits in accordance with an exemplary embodiment of the present invention. Between the supply voltage 1409 and the supply connection of amplifier 1400 located at node 1422 is inductance 1410, which may be parasitic or added for some function, such as to act as a choke. Due to ac currents passing through inductor 1410, an ac voltage may be generated on node 1422 superimposed on the dc voltage imposed by supply 1409. This ac voltage ripple may cause problems in the supply circuits for drivers 1406 and 1408 if precautions are not taken, such as those described above in regards to the supply sharing circuit of FIG. 13.

To reduce the driver supply voltage which may result, more than one rectifying device may be placed in series between driver supply nodes 1414 and 1416. Furthermore, switches 1424 can be used so that by closing the appropriate switch or switches, one or more rectifying devices may be bypassed. When this is done, the supply voltages applied to the drivers will typically increase due to the reduced number of rectifier forward voltage drops since only the rectifying devices which are not bypassed drop this voltage during conduction. Thus by changing switch settings, the driver supply voltages may be changed in discrete steps. Furthermore, by monitoring the voltage on node 1416, a control circuit can be used to vary the number of bypassed rectifying devices so as to keep the voltage at node 1416 close to a desired level. By doing this, variations in driver supply voltages such as due to variations in supply voltage 1409 or variations in the amount of induced ac voltage on node 1422 can be compensated for.

Figure 15:
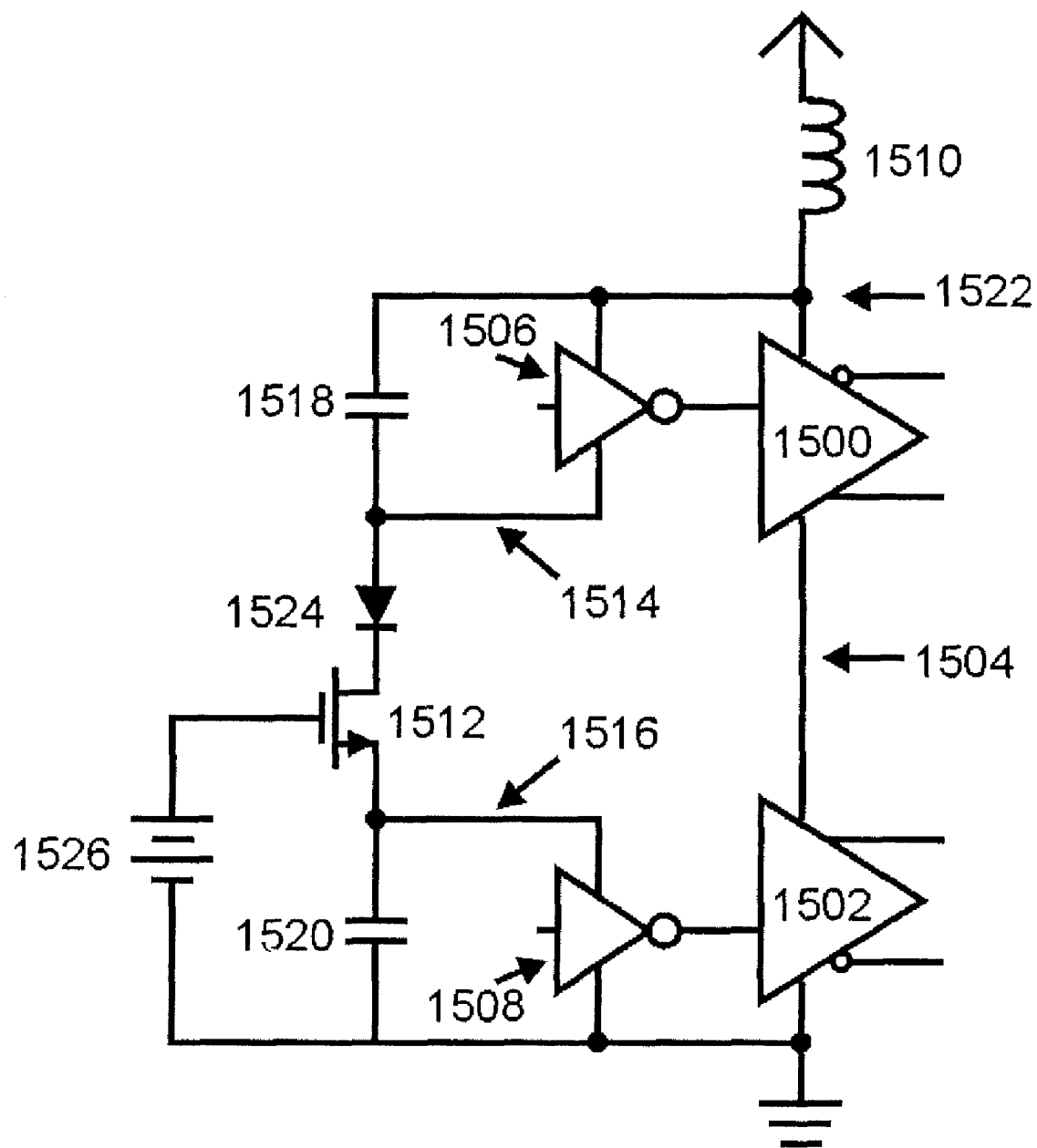
FIG. 15 is a diagram of a supply sharing circuit for driver circuits in accordance with an exemplary embodiment of the present invention.

FIG. 15 is a diagram of a supply sharing circuit for driver circuits in accordance with an exemplary embodiment of the present invention. Between the supply voltage and the supply connection of amplifier 1500 located at node 1522 is inductance 1510, which may be parasitic or added for some function, such as to act as a choke. Due to ac currents passing through inductor 1510, an ac voltage may be generated on node 1522 superimposed on the dc voltage imposed by the supply. This ac voltage ripple may cause problems in the supply circuits for drivers 1506 and 1508 if precautions are not taken, such as those described above in regards to the supply sharing circuit of FIG. 13. In one exemplary embodiment, the method and configuration described in FIG. 11*a* can be advantageously applied to provide the required voltage regulation using transistor 1512 and a suitable control voltage 1526 which may be a fixed voltage or be generated by a feedback circuit or some other suitable circuit.

Figure 16A:
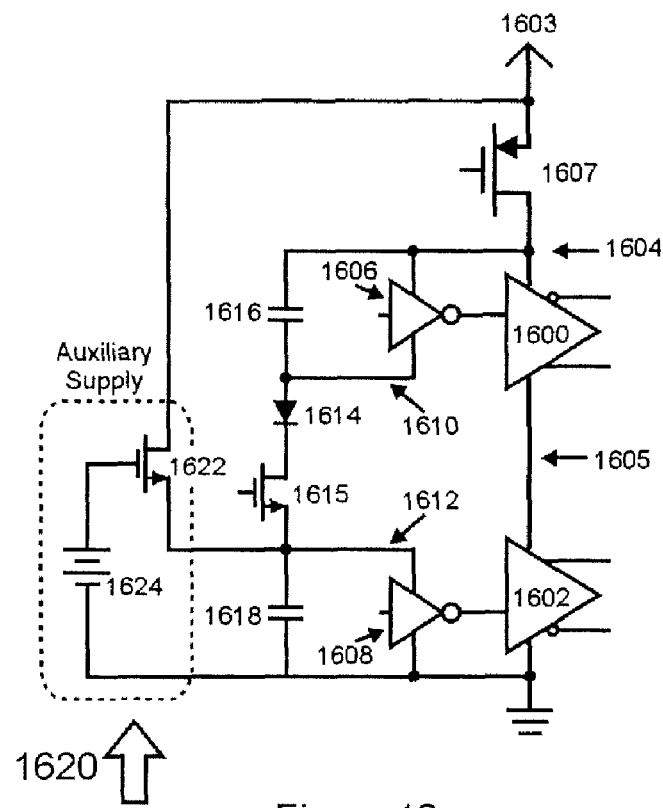
FIG. 16a is a diagram of another supply sharing circuit for driver circuits in accordance with an exemplary embodiment of the present invention.

FIG. 16*a* is a diagram of a supply sharing circuit for driver circuits in accordance with an exemplary embodiment of the present invention. In this exemplary embodiment, the supply voltage 1604 for the driver and amplifier combination has been generated from a higher voltage supply 1603 using transistor 1607. Transistor 1607 can be used to implement power control, such as by modifying the output power created by 1600 and 1602, by changing the voltage 1604, and in other suitable manners.

One potential issue with reducing the output power by reducing the voltage at internal supply node 1604 is that the driver circuits may have insufficient supply voltage to function correctly at some lower range of power levels. By way of example, if drivers 1606 and 1608 were to require at least 1V across each of their supply nodes to function correctly, the drivers would be unable to function with less than 2V on node 1604. To reduce this effect, an auxiliary supply path 1620 can be implemented which can be activated to provide supply current to driver circuit 1608 directly from supply 1603, in certain situations such as when the voltage at node 1604 is insufficient to adequately supply drivers 1606 and 1608.

Auxiliary path 1620 consists of NMOS transistor 1622 to which an appropriate gate voltage 1624 is applied so as to regulate the supply voltage 1612 of driver circuit 1608 during times when the auxiliary path is active. In this manner, transistor 1622 can act as a source follower device, and can regulate the voltage at node 1612 relative to ground. If the auxiliary path is inactive, the voltage can be set to a sufficiently low voltage to turn transistor 1622 completely off. Alternatively, the gate voltage 1624 can be set so that the auxiliary path will regulate to a voltage on node 1612 which is less than the voltage produced by the series-supply path when there is sufficient voltage for that path to be correctly functioning. In this case, transistor 1622 can reduce its current or even turn off completely when the series-supply path is active without any change in gate voltage 1624 being necessary, such as by reducing the gate-source voltage on transistor 1622 when the node 1612 is at the higher voltage produced by the series-supply circuit.

Figure 16B:
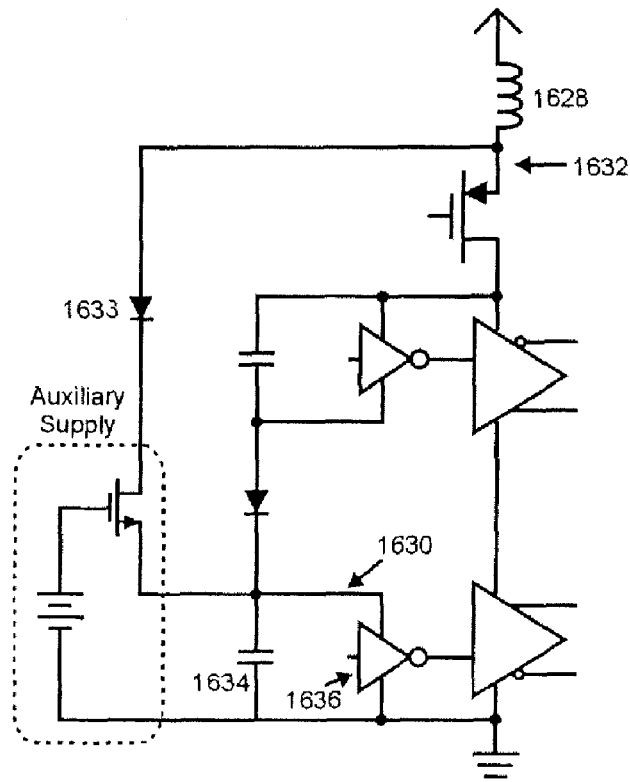
FIG. 16b is a diagram of an augmented supply sharing circuit for driver circuits in accordance with an exemplary embodiment of the present invention.

FIG. 16*b* is a diagram of an augmented supply sharing circuit for driver circuits in accordance with an exemplary embodiment of the present invention. In this circuit, inductance 1628 (which can be a parasitic inductance or have a selected value) can be used to create an ac voltage on supply node 1632. This ac voltage can potentially compromise correct functioning of the auxiliary supply path in cases where the voltage on node 1632 is temporarily less than the voltage on node 1630. To reduce or eliminate this effect, a rectifying device 1633 such as a diode or a diode-connected transistor can be placed in series with the auxiliary current path to reduce or eliminate this reverse current. Capacitor 1634 can be used to source supply current into driver 1636 during the times wherein the rectifying device 1633 is reverse biased.

Figure 17A:
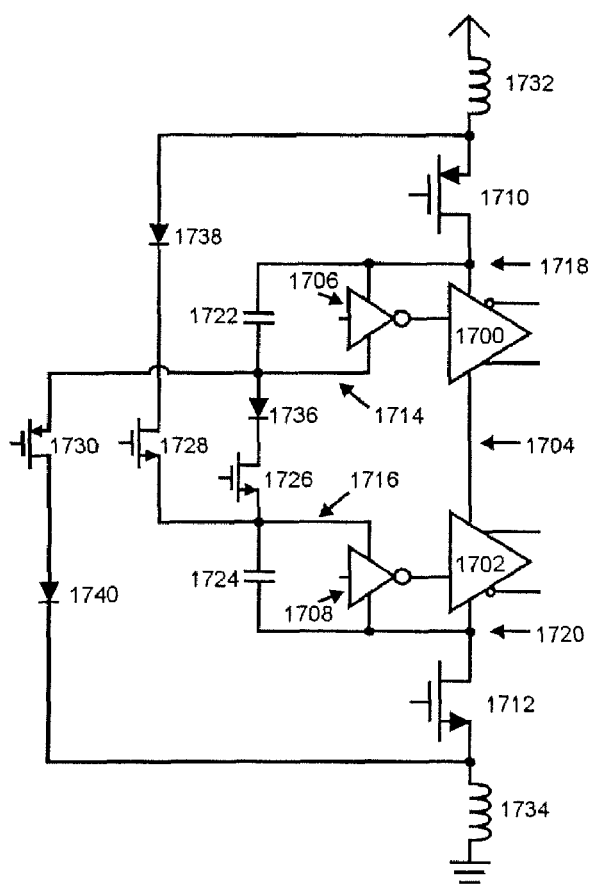
FIG. 17a is a diagram of a supply sharing circuit for driver circuits in accordance with an exemplary embodiment of the present invention.

FIG. 17a is a diagram of a supply sharing circuit for driver circuits in accordance with an exemplary embodiment of the present invention. In this exemplary embodiment, the supply voltage for the driver and amplifier combination consisting of the voltage difference between nodes 1718 and 1720 has been generated from a higher voltage supply using transistor 1710 and supply transistor 1712. Transistors 1710 and 1712 can be used to implement power control, such as by modifying the output power created by 1700 and 1702, by changing the voltages at 1718 or 1720, and in other suitable manners. Transistors 1710 and 1712 each drop supply voltage—typically nearly equal to each other—to reduce the output power to provide power control function. This can reduce the voltage between 1718 and 1720 such as to perform power control function. In some situations, such as when transistors 1710 and 1712 are dropping relatively large amounts of voltage, the series-supply path may no longer be able to supply the drivers as in the supply sharing circuit for driver circuits shown in FIG. 16a. Two auxiliary paths are used to supply the two drivers in these situations, and rectifying devices 1738 and 1740 may be used to reduce the effects of any ac corruption of the supplies, such inductor bounce.

Figure 17B:
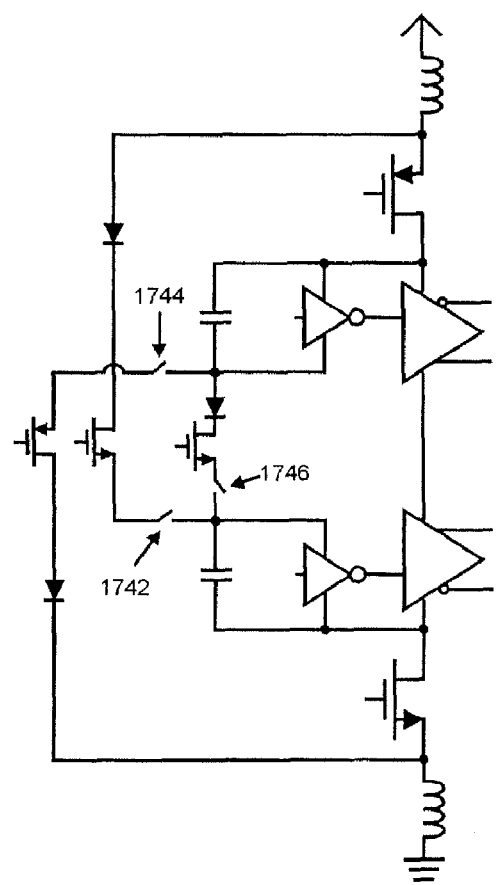
FIG. 17b is a diagram of an alternative method and configuration to select the series-supply path or the auxiliary paths.

FIG. 17b is a diagram of an alternative method and configuration to select the series-supply path or the auxiliary paths. In this exemplary embodiment, additional switches 1742 and 1744 are placed in series with the auxiliary supply paths and switch 1746 is placed in series with the series-supply path. By closing switch 1746 and opening switches 1742 and 1744, the series-supply path may be selected. To select the auxiliary supplies, switches 1742 and 1744 may be closed while switch 1746 is opened.

Figure 18:
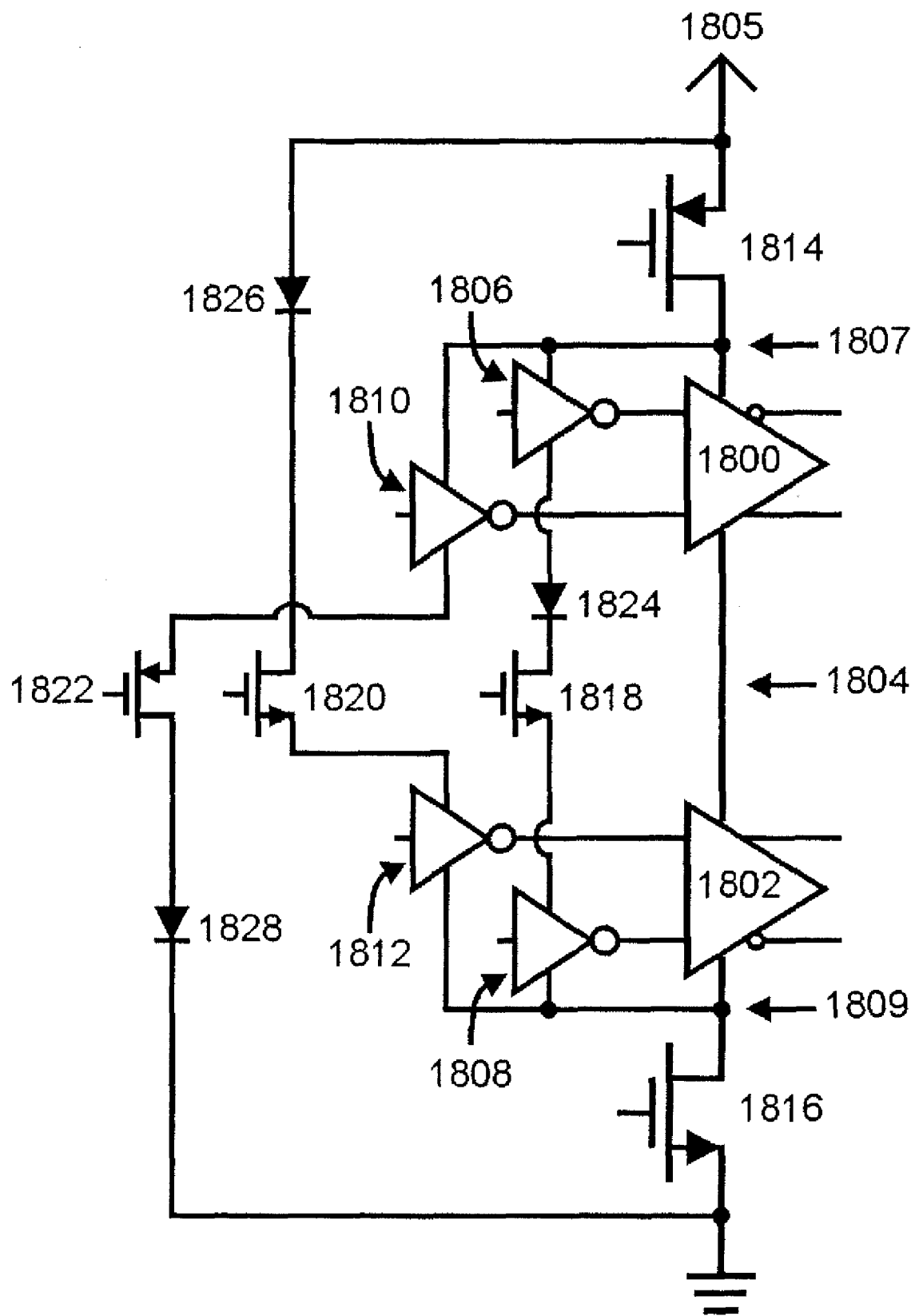
FIG. 18 is a diagram of a supply sharing circuit for driver circuits similar to that shown in FIG. 17a, except that the amplifiers each have a main input and an auxiliary input.

FIG. 18 is a diagram of a supply sharing circuit for driver circuits similar to that shown in FIG. 17a, except that the amplifiers 1800 and 1802 each have a main input and an auxiliary input. The main inputs are provided inputs from drivers 1806 and 1808 taking their supply currents from a series supply path which may be active when the output power is high, such as when the voltage across 1807 and 1809 is sufficient to supply the series-supply current path. The auxiliary inputs are provided inputs from drivers 1810 and 1812 which take their supply currents from auxiliary supply paths. The supply sharing circuit of FIG. 18 can be operated with both the main and auxiliary paths activated, except at low power when the main path naturally fails, or so that the auxiliary paths are turned off at high power. Note that diodes 1826 and 1828 can be used to avoid problems with ac on the supply nodes 1807 and 1809, such as when an inductor is used in series with the supply.

Figure 19:
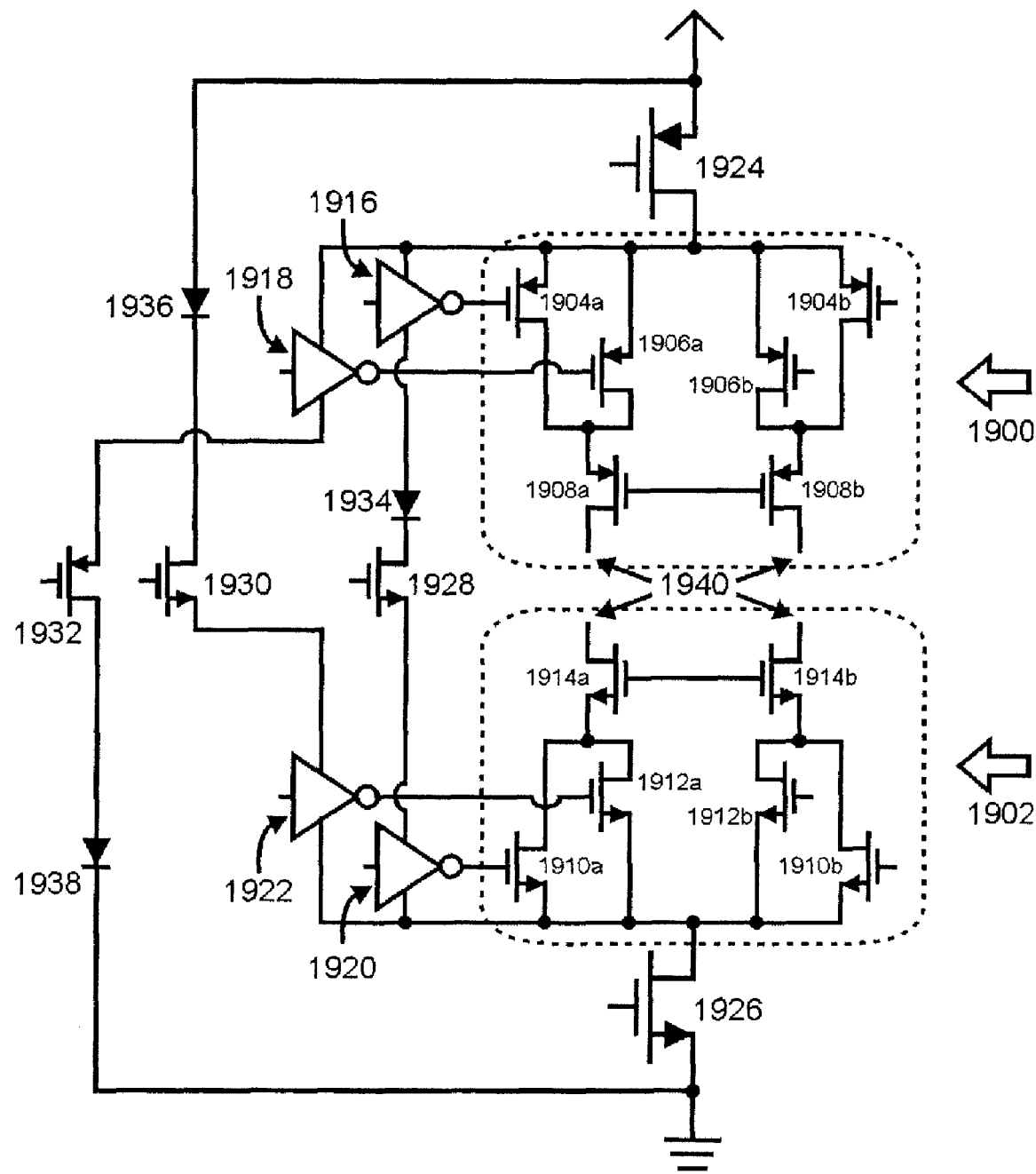
FIG. 19 is a diagram of a supply sharing circuit for driver circuits similar to that shown in FIG. 18, except that the amplifier is implemented using main input transistors.

FIG. 19 is a diagram of a supply sharing circuit for driver circuits similar to that shown in FIG. 18 with exemplary amplifiers 1900 and 1902 having main and auxiliary inputs. Amplifier 1900 is implemented using main input transistors 1904a and 1904b. Input transistor 1904a receives input signals from main driver circuit 1916. Auxiliary input transistor 1906a receives input signals from auxiliary driver circuits such as driver 1918. The driver circuits for input transistors 1904b and 1906b are not explicitly shown, but can be configured in a similar manner. The drains of input transistors 1904a and 1906a connect to the source of cascode transistor 1908a while the drains of input transistors 1904b and 1906b connect to the source of cascode transistor 1908b. A similar configuration can be used for amplifier 1902. Main drivers 1916 and 1920 can provide input signals to amplifiers 1900 and 1902 in situations where their series supply path has sufficient voltage to operate. When the series supply path has insufficient voltage, such as when transistors 1924 and 1926 are dropping relatively large voltages, the outputs of the main drivers may be unable to provide appropriate signals to transistors 1904 and 1910, such as if the signals are too weak or at the wrong dc bias point. Auxiliary drivers 1916 and 1920 can be used to drive auxiliary input transistors 1906 and 1910, so that the auxiliary transistors can provide all or most of the control of the output gain of amplifiers 1900 and 1902.

The drains of cascode transistors 1908 and 1914 form the outputs 1940 of the amplifiers which may be connected to an appropriate DAT such as in, for example, FIG. 2a, FIG. 4, and FIG. 6. Alternatively the outputs can be combined in other suitable ways or used separately. Furthermore, amplifiers 1900 and 1902 can be implemented using other suitable complementary circuits, such as by eliminating cascode transistors 1908 and 1914 and using the connected the drains of transistors 1904 and 1906 and the connected drains of transistors 1910 and 1912 as outputs directly, or other suitable circuits.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. An integrated circuit comprising:
  a first primary circuit;
  a secondary circuit inductively coupled to the first primary circuit;
  a second primary circuit inductively coupled to the secondary circuit; and
  a plurality of amplifiers having differential outputs and coupled to the first primary circuit and the second primary circuit, wherein the plurality of amplifiers are for generating a voltage waveform on the first primary circuit and the second primary circuit to generate a voltage waveform on the secondary circuit, wherein one or more of the amplifiers further comprises a cross-coupled oscillator generating signals that are substantially out of phase.

2. The integrated circuit of claim 1 wherein one or more of the amplifiers is coupled to each of the first primary circuit and the second primary circuit.

3. The integrated circuit of claim 1 wherein one or more of the amplifiers further comprises two signal sources generating signals that are substantially out of phase.

4. The integrated circuit of claim 1 wherein one or more of the amplifiers further comprises two transistors generating signals that are substantially out of phase.

5. The integrated circuit of claim 1 wherein the first primary circuit and the second primary circuit are coupled at one or more locations.

6. The integrated circuit of claim 1 wherein the first primary circuit and the second primary circuit are coupled at one or more locations between the plurality of amplifiers.

7. The integrated circuit of claim 1 wherein one or more of the amplifiers is coupled to the first primary circuit and one or more of the amplifiers is coupled to each of the first primary circuit and the second primary circuit.

8. The integrated circuit of claim 1 wherein the integrated circuit is monolithically integrated.

9. The integrated circuit of claim 1 wherein the first primary circuit comprises a slab inductor.

10. The integrated circuit of claim 9 wherein the second primary circuit comprises a slab inductor.

11. The integrated circuit of claim 9 wherein the secondary circuit comprises a slab inductor.

12. The integrated circuit of claim 1 wherein the secondary circuit comprises a slab inductor.

13. The integrated circuit of claim 1 wherein the first primary circuit and the second primary circuit are coupled at one or more locations between two of the plurality of amplifiers.

14. The integrated circuit of claim 1 further comprising a driver circuit coupled to one or more of the amplifiers.

15. A monolithically integrated circuit comprising:
a first primary circuit comprising one or more slab inductors;
a secondary circuit comprising one or more slab inductors, the secondary circuit inductively coupled to the first primary circuit;
a second primary circuit comprising one or more slab inductors, the second primary circuit inductively coupled to the secondary circuit;
a plurality of first amplifiers having differential outputs coupled to the first primary circuit;
a plurality of second amplifiers having differential amplifiers coupled to the second primary circuit;
the first primary circuit and the second primary circuit are coupled at one or more locations between the first amplifiers and the second amplifiers;
one or more first driver circuits each coupled to one of the first amplifiers;
one or more second driver circuits each coupled to one of the second amplifiers;
wherein the plurality of amplifiers are for generating a differential output that is substantially out of phase so as to generate a voltage waveform on the first primary circuit and the second primary circuit so as to generate a voltage waveform on the secondary circuit.

16. An integrated circuit comprising:
a first primary circuit;
a secondary circuit inductively coupled to the first primary circuit;
a second primary circuit inductively coupled to the secondary circuit; and
a plurality of amplifiers having differential outputs and coupled to the first primary circuit and the second primary circuit, wherein the plurality of amplifiers are for generating a voltage waveform on the first primary circuit and the second primary circuit to generate a voltage waveform on the secondary circuit, wherein one or more of the amplifiers further comprises a cross-coupled oscillator generating signals that are substantially out of phase, and wherein the integrated circuit is monolithically integrated.

17. The integrated circuit of claim 16 wherein one or more of the amplifiers is coupled to each of the first primary circuit and the second primary circuit.

18. The integrated circuit of claim 16 wherein one or more of the amplifiers further comprises two signal sources generating signals that are substantially out of phase.

19. The integrated circuit of claim 16 wherein one or more of the amplifiers further comprises two transistors generating signals that are substantially out of phase.

20. The integrated circuit of claim 16 wherein the first primary circuit and the second primary circuit are coupled at one or more locations.

* * * * *